(12) United States Patent
Lee

(10) Patent No.: US 11,948,993 B2
(45) Date of Patent: Apr. 2, 2024

(54) SEMICONDUCTOR DEVICE AND MANUFACTURING METHOD OF THE SEMICONDUCTOR DEVICE

(71) Applicant: SK hynix Inc., Icheon-si (KR)

(72) Inventor: Nam Jae Lee, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 18/119,198

(22) Filed: Mar. 8, 2023

(65) Prior Publication Data

US 2023/0223457 A1 Jul. 13, 2023

Related U.S. Application Data

(63) Continuation of application No. 17/161,080, filed on Jan. 28, 2021, now Pat. No. 11,637,190.

(30) Foreign Application Priority Data

Aug. 3, 2020 (KR) .......................... 10-2020-0097015

(51) Int. Cl.
*H01L 29/45* (2006.01)
*H01L 29/78* (2006.01)
*H10B 43/27* (2023.01)

(52) U.S. Cl.
CPC ........ *H01L 29/458* (2013.01); *H01L 29/7827* (2013.01); *H10B 43/27* (2023.02)

(58) Field of Classification Search
CPC . H01L 29/458; H01L 29/7827; H01L 27/108; H01L 27/10897; H01L 2924/1436; H01L 2924/14369; H01L 27/1023; H01L 28/40; H01L 28/92; H10B 43/27; G11C 11/401; G11C 11/4099; G11C 14/0009; G11C 14/0045; G11C 2211/4016
See application file for complete search history.

(56) References Cited

U.S. PATENT DOCUMENTS

| | | |
|---|---|---|
| 9,721,963 B1 | 8/2017 | Rabkin et al. |
| 10,515,810 B2 | 12/2019 | Lai et al. |
| 2013/0277731 A1 | 10/2013 | Goda et al. |
| 2015/0243672 A1 | 8/2015 | Kim |
| 2016/0343712 A1 | 11/2016 | Xu |
| 2019/0229062 A1 | 7/2019 | Shin et al. |
| 2019/0288000 A1* | 9/2019 | Choi ................... H01L 29/0649 |
| 2021/0159169 A1 | 5/2021 | Zhao et al. |
| 2021/0288067 A1 | 9/2021 | Kanamori et al. |

* cited by examiner

*Primary Examiner* — Mohammad A Rahman
(74) *Attorney, Agent, or Firm* — William Park & Associates Ltd.

(57) ABSTRACT

The present technology provides a semiconductor device. The semiconductor device includes a stack including insulating patterns and conductive patterns stacked alternately with each other, a channel layer including a first channel portion protruding out of the stack and a second channel portion in the stack, and passing through the stack, and a conductive line surrounding the first channel portion, and the first channel portion includes metal silicide.

15 Claims, 22 Drawing Sheets

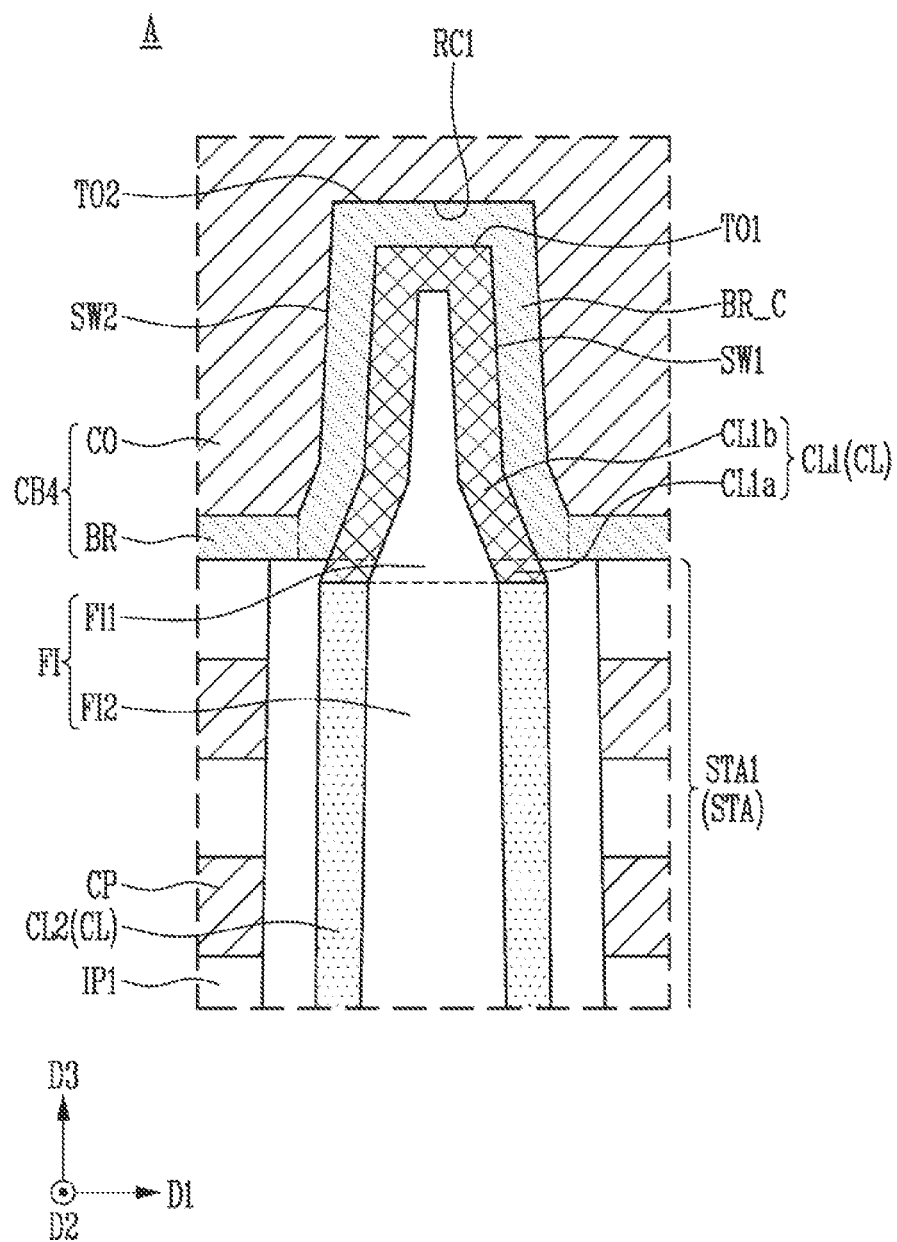

SEMICONDUCTOR DEVICE AND MANUFACTURING METHOD OF THE SEMICONDUCTOR DEVICE

CROSS-REFERENCE TO RELATED APPLICATION

The present application is a continuation application of U.S. patent application Ser. No. 17/161,080, filed on Jan. 28, 2021, and claims priority under 35 U.S.C. § 119(a) to Korean patent application number 10-2020-0097015, filed on Aug. 3, 2020, in the Korean Intellectual Property Office, the entire disclosure of which is incorporated herein by reference.

BACKGROUND

1. Technical Field

The present disclosure relates to a semiconductor device and a method of manufacturing the semiconductor device, and more particularly, to a three-dimensional semiconductor device and a method of manufacturing the three-dimensional semiconductor device.

2. Related Art

A semiconductor memory device includes memory cells capable of storing data. A three-dimensional semiconductor memory device includes memory cells arranged in a three-dimension, thereby decreasing an area occupied by the memory cells per unit area of a substrate.

In order to improve a degree of integration of the three-dimensional semiconductor memory device, the number of stacks of the memory cells may be increased. As the number of stacks of the memory cells is increased, operation reliability of the three-dimensional semiconductor memory device may be decreased.

SUMMARY

A semiconductor device according to an embodiment of the present disclosure may include a stack including insulating patterns and conductive patterns stacked alternately with each other, a channel layer including a first channel portion protruding out of the stack and a second channel portion in the stack, and passing through the stack, and a conductive line surrounding the first channel portion, and the first channel portion may include metal silicide.

A semiconductor device according to an embodiment of the present disclosure may include a stack including insulating patterns and conductive patterns stacked alternately with each other, a channel layer including a first channel portion protruding out of the stack and a second channel portion in the stack, and passing through the stack, and a conductive line surrounding the first channel portion, and the first channel portion, the second channel portion, and the conductive line may include different materials.

A method of manufacturing a semiconductor device according to an embodiment of the present disclosure may include forming a support structure, forming a stack on the support structure, forming a channel layer passing through the stack, removing the support structure to expose a first protrusion of the channel layer, forming a diffusion metal layer that is in contact with the first protrusion, performing a thermal process to change the first protrusion into a first channel portion, and removing the diffusion metal layer.

A method of manufacturing a semiconductor device according to an embodiment of the present disclosure may include forming a support structure, forming a stack on the support structure, forming a channel layer passing through the stack, removing the support structure to expose an upper surface and a sidewall of the first protrusion of the channel layer, forming a diffusion metal layer covering the upper surface and the sidewall of the first protrusion, and performing a thermal process to change the first protrusion into a first channel portion.

BRIEF DESCRIPTION OF THE DRAWINGS

FIG. 1B is an enlarged view of a region A of FIG. 1A.

DETAILED DESCRIPTION

Specific structural or functional descriptions of embodiments according to the concept which are disclosed in the present specification or application are illustrated only to describe the embodiments according to the concept of the present disclosure. The embodiments according to the concept of the present disclosure may be carried out in various forms and should not be construed as limited to the embodiments described in the present specification or application.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present disclosure.

It will be understood that when an element or layer is referred to as being "surrounded by," "covered by," "on," "connected to," "coupled to," or "in contact with" another element or layer, it can be directly on, connected, coupled to, covered by, surrounded by, or in contact with the other element or layer or intervening elements or layers may be present. In contrast, when an element is referred to as being "directly surrounded by," "directly on," "directly connected to" "directly covered by," or "directly coupled to" another element or layer, there are no intervening elements or layers present. Like numerals refer to like elements throughout.

Embodiments of the present disclosure provide a semiconductor device and a method of manufacturing the semiconductor device capable of improving operation reliability.

In the semiconductor device according to embodiments of the present technology, a portion of the channel layer that is in contact with the conductive line may be formed of metal silicide, and thus the conductive line may be formed of a metal material.

Figure 1A:
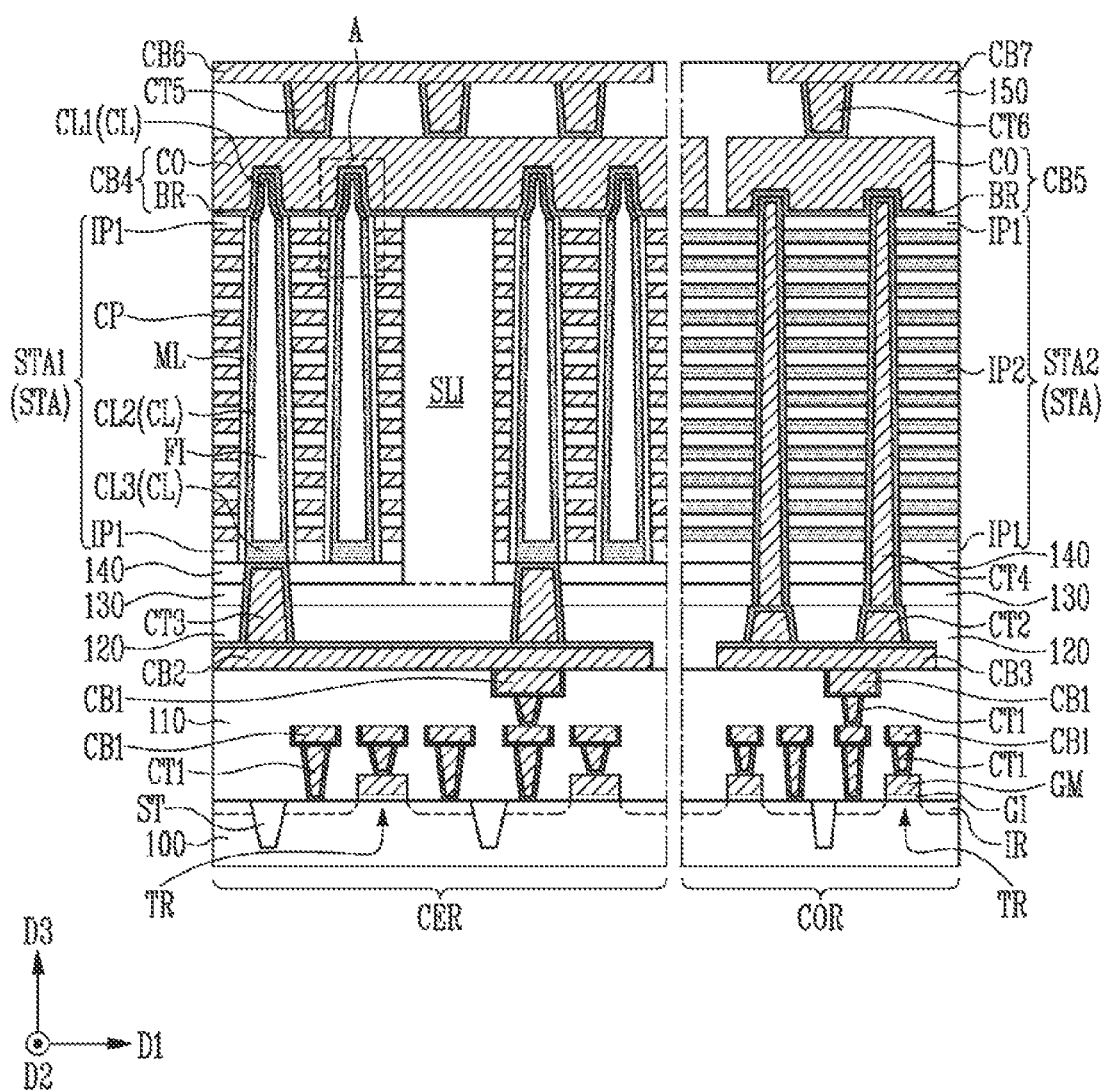
FIG. 1A is a cross-sectional view of a semiconductor device according to an embodiment of the present disclosure.

FIG. 1A is a cross-sectional view of a semiconductor device according to an embodiment of the present disclosure. FIG. 1B is an enlarged view of a region A of FIG. 1A.

Referring to FIGS. 1A and 1B, the semiconductor device may include a cell region CER and a connection region COR. The cell region CER and the connection region COR may be regions divided in a plane.

The semiconductor device may include a substrate 100. The substrate 100 may have a shape of a plate extending along a plane defined by a first direction D1 and a second direction D2. The first direction D1 and the second direction D2 may cross each other. For example, the first direction D1 and the second direction D2 may be orthogonal to each other. The substrate 100 may extend from the cell region CER to the connection region COR. For example, the substrate 100 may extend in the first direction D1. The substrate 100 may include a semiconductor material. For example, the substrate 100 may include silicon.

A first insulating layer 110 may be provided on the substrate 100. The first insulating layer 110 may cover the substrate 100. The first insulating layer 110 may include an insulating material. For example, the first insulating layer 110 may include oxide.

Peripheral transistors TR may be provided between the substrate 100 and the first insulating layer 110. The peripheral transistors TR may be transistors configuring a peripheral circuit of the semiconductor device.

The peripheral transistor TR may include impurity regions IR, a gate insulating layer GI, and a gate electrode GM. The impurity regions IR may be provided in the substrate 100. The impurity regions IR may be formed by doping an impurity into the substrate 100. A channel of the peripheral transistor TR may be formed between the impurity regions IR. The gate electrode GM may be spaced apart from the substrate 100 with the gate insulating layer GI interposed therebetween. The gate electrode GM may include a conductive material, and the gate insulating layer GI may include an insulating material.

An element isolation layer ST may be provided in the substrate 100. The element isolation layer ST may electrically isolate the peripheral transistors TR, which configures the peripheral circuit, from each other. The element isolation layer ST may include an insulating material.

First contacts CT1 and first conductors CB1 may be provided in the first insulating layer 110. The impurity regions IR and the gate electrodes GM of the peripheral transistors TR may be in contact with the first contacts CT1. The first contacts CT1 and the first conductors CB1 may be electrically connected to the peripheral transistors TR. Each of the first contacts CT1 and the first conductors CB1 may include a conductive layer and a barrier layer surrounding the conductive layer. For example, the conductive layer may include copper, tungsten, or aluminum. For example, the barrier layer may include titanium, titanium nitride, tantalum, or tantalum nitride. A width of the first contacts CT1 may decrease as the first contacts CT1 close to the peripheral transistors TR. The first contacts CT1 may extend in a third direction D3. The third direction D3 may cross the first direction D1 and the second direction D2. For example, the third direction D3 may be orthogonal to the first direction D1 and the second direction D2.

A second insulating layer 120 may be provided on the first insulating layer 110. The second insulating layer 120 may cover the first insulating layer 110. The second insulating layer 120 may include an insulating material. For example, the second insulating layer 120 may include oxide.

A second conductor CB2, a third conductor CB3, and second contacts CT2 may be provided in the second insulating layer 120. The second conductor CB2 may be provided in the cell region CER. The second conductor CB2 may be in contact with the first conductor CB1 disposed in the cell region CER. The second conductor CB2 may be a conductive line extending in the first direction D1. The second conductor CB2 may be used as a bit line of the semiconductor device.

The third conductor CB3 may be provided in the connection region COR. The third conductor CB3 may be in contact with the first conductor CB1 disposed in the connection region COR.

The second contacts CT2 may be in contact with the third conductor CB3. The second contacts CT2 may be provided in the connection region COR. The second contacts CT2 may extend in the third direction D3. A width of the second contacts CT2 may increase as the second contacts CT2 close to the peripheral transistors TR.

Each of the second and third conductors CB2 and CB3 and the second contacts CT2 may include a conductive layer and a barrier layer.

A third insulating layer 130 may be provided on the second insulating layer 120. The third insulating layer 130 may cover the second insulating layer 120. The third insulating layer 130 may include an insulating material. For example, the third insulating layer 130 may include oxide.

A fourth insulating layer 140 may be provided on the third insulating layer 130. The fourth insulating layer 140 may cover the third insulating layer 130. The fourth insulating layer 140 may include an insulating material. For example, the fourth insulating layer 140 may include oxide.

Third contacts CT3 may be provided in the second to fourth insulating layers 120, 130, and 140. The third contacts CT3 may pass through the third and fourth insulating layers 130 and 140. The third contacts CT3 may be in contact with the second conductor CB2. The third contacts CT3 may be provided in the cell region CER. Each of the third contacts CT3 may include a conductive layer and a barrier layer. The third contacts CT3 may extend in the third direction D3. A width of the third contacts CT3 may increase as the third contacts CT3 close to the peripheral transistors TR.

A stack STA may be provided on the fourth insulating layer 140. The stack STA may include a first stack portion STA1 in the cell region CER and a second stack portion STA2 in the connection region COR.

The first stack portion STA1 may include first insulating patterns IP1 and conductive patterns CP stacked alternately with each other in the third direction D3. The first insulating patterns IP1 may include an insulating material. For example, the first insulating patterns IP1 may include oxide. The conductive patterns CP may include a gate conductive layer. The gate conductive layer may include a conductive material. For example, the gate conductive layer may include at least one of a doped silicon layer, a metal silicide layer, tungsten, nickel, and cobalt. The gate conductive layer may be used as a word line connected to a memory cell or a select line connected to a select transistor. The conductive patterns CP of the first stack portion STA1 may further include a gate barrier layer surrounding the gate conductive layer. For example, the gate barrier layer may include titanium, titanium nitride, tantalum, or tantalum nitride.

The second stack portion STA2 may include first insulating patterns IP1 and second insulating patterns IP2 stacked alternately with each other in the third direction D3. The first insulating patterns IP1 may include an insulating material. For example, the first insulating patterns IP1 may include oxide. The second insulating patterns IP2 may include a material different from that of the first insulating patterns IP1. For example, the second insulating patterns IP2 may include nitride.

The first insulating patterns IP1 of the second stack portion STA2 may be disposed at the same level as the first insulating patterns IP1 of the first stack portion STA1. The first insulating patterns IP1 of the second stack portion STA2 and the first insulating patterns IP1 of the first stack portion STA1 may be successively formed without a boundary. The second insulating patterns IP2 of the second stack portion STA2 may be disposed at the same level as the conductive patterns CP of the first stack portion STA1.

Filling layers FI passing through the first stack portion STA1 of the stack STA may be provided. The filling layers FI may extend in the third direction D3. The filling layers FI may pass through the first insulating patterns IP1 and the conductive patterns CP of the first stack portion STA1 of the stack STA. The first insulating patterns IP1 and the conductive patterns CP of the first stack portion STA1 of the stack STA may surround the filling layers FI. The filling layers FI may include an insulating material. For example, the filling layers FI may include oxide.

Channel layers CL passing through the first stack portion STA1 of the stack STA may be provided. The channel layers CL may extend in the third direction D3. The channel layers CL may pass through the first insulating patterns IP1 and the conductive patterns CP of the first stack portion STA1 of the stack STA. The first insulating patterns IP1 and the conductive patterns CP of the first stack portion STA1 of the stack STA may surround the channel layers CL. The channel layer CL may surround the filling layer FI.

The channel layer CL may be connected to the second conductor CB2 through the third contact CT3. The semiconductor device may include the third contacts CT3 and the second conductor CB2 shown in FIG. 1A, and may include third contacts and second conductors which are not shown in FIG. 1A. The channel layers CL which are not connected to the third contacts CT3 and the second conductors CB2 shown in FIG. 1A may be connected to the third contacts and the second conductors which are not shown in FIG. 1A. The channel layer CL may be electrically connected to the peripheral transistor TR through the third contact CT3, the second conductor CB2, the first conductor CB1, and the first contact CT1.

The channel layer CL may include a first channel portion CL1 protruding out of the first stack portion STA1 of the stack STA, and a second channel portion CL2 and a third channel portion CL3 in the first stack portion STA1 of the stack STA. The first channel portion CL1 may be a portion protruding above the first stack portion STA1 of the stack STA. The first channel portion CL1 may be a portion surrounding a sidewall of the filling layer FI. The third channel portion CL3 may be a portion that is in contact with the third contact CT3 under the first stack portion STA1 of the stack STA. The third channel portion CL3 may be a portion covering a lower surface of the filling layer FI. The second channel portion CL2 may be a portion connecting the first channel portion CL1 and the third channel portion CL3 between the first channel portion CL1 and the third channel portion CL3. The second channel portion CL2 may extend in the third direction D3 and pass through a plurality of conductive patterns CP and first insulating patterns IP1. The second channel portion CL2 may be a portion surrounding a sidewall of the filling layer FI.

The first channel portion CL1 may include a material different from that of the second and third channel portions CL2 and CL3. The second and third channel portions CL2 and CL3 may include polysilicon. The first channel portion CL1 may include metal silicide. For example, the first channel portion CL1 may include metal silicide that may be formed at a temperature of 450° C. or less. For example, the first channel portion CL1 may include metal silicide that may be formed by combining metal and silicon at a temperature of 450° C. or less. For example, the first channel portion CL1 may include nickel silicide. For example, composition of nickel silicide included in the first channel portion CL1 may be NiSi. The first channel portion CL1 and the second channel portion CL2 may form an ohmic contact.

Memory layers ML passing through the first stack portion STA1 of the stack STA may be provided. The memory layers ML may extend in the third direction D3. The memory layers ML may pass through the first insulating patterns IP1 and the conductive patterns CP of the first stack portion STA1 of the stack STA. The first insulating patterns IP1 and the conductive patterns CP of the first stack portion STA1 of the stack STA may surround the memory layers ML. The memory layer ML may surround the second channel portion CL2 and the third channel portion CL3 of the channel layer CL.

The memory layer ML may include a tunnel insulating layer surrounding the channel layer CL, a data storage layer surrounding the tunnel insulating layer, and a blocking layer surrounding the data storage layer. The tunnel insulating layer may include a material capable of charge tunneling. For example, the tunnel insulating layer may include oxide. In an embodiment, the data storage layer may include a material capable of trapping a charge. For example, the data storage layer may include nitride. In another embodiment, the data storage layer may include various materials according to a data storage method. For example, the data storage layer may include silicon, a phase change material, or a nano-dot. The blocking layer may include a material capable of blocking a movement of a charge. For example, the blocking layer may include oxide.

Fourth contacts CT4 passing through the third insulating layer 130, the fourth insulating layer 140, and the second stack portion STA2 of the stack STA may be provided. The fourth contacts CT4 may extend in the third direction D3. The fourth contacts CT4 may pass through the first insulating patterns IP1 and the second insulating patterns IP2 of the second stack portion STA2 of the stack STA. The first insulating patterns IP1 and the second insulating patterns IP2 of the second stack portion STA2 of the stack STA may surround the fourth contacts CT4. A portion of the fourth contact CT4 may protrude above the second stack portion STA2 of the stack STA. The fourth contact CT4 may include a conductive layer and a barrier layer. The fourth contact CT4 may be in contact with the second contact CT2.

A slit insulating layer SLI passing through the fourth insulating layer 140 and the first stack portion STA1 of the stack STA may be provided. The slit insulating layer SLI may extend in the second direction D2 and the third direction D3. The slit insulating layer SLI may pass through the first insulating patterns IP1 and the conductive patterns CP of the first stack portion STA1 of the stack STA. The conductive patterns CP on both sides of the slit insulating layer SLI may be spaced apart from each other in the first direction D1 by the slit insulating layer SLI. The first insulating patterns IP1 on both sides of the slit insulating layer SLI may be spaced apart from each other in the first direction D1 by the slit insulating layer SLI.

The slit insulating layer SLI may include the same material as the third insulating layer 130. For example, the slit insulating layer SLI may include oxide. The slit insulating layer SLI may be formed successively with the third insulating layer 130 without a boundary.

A fourth conductor CB4 covering the first stack portion STA1 of the stack STA may be provided. The fourth conductor CB4 may extend from the cell region CER to the connection region COR. The fourth conductor CB4 may be a conductive line extending in the first direction D1. The fourth conductor CB4 may be used as a source line of the semiconductor device. The fourth conductor CB4 may be in contact with the first channel portions CL1 of the channel layers CL. The fourth conductor CB4 may surround the first channel portions CL1 of the channel layers CL. The fourth conductor CB4 may include a material different from that of the first channel portion CL1 and the second channel portion CL2. In an embodiment, the fourth conductor CB4 may be in direct contact with the first channel portion CL1. In an embodiment, the fourth conductor CB4 may be in direct contact with the second portion CL1$b$ of the first channel portion CL1. In an embodiment, the barrier layer BR of the fourth conductor CB4 may be in direct contact with the first channel portion CL1. In an embodiment, the barrier layer BR of the fourth conductor CB4 may be in direct contact with the second portion CL1$b$ of the first channel portion CL1. In an embodiment, the first portion CL1$a$ may be in direct contact with the second channel portion CL2. In an embodiment, the second portion CL1$b$ is spaced apart from the second channel portion CL2.

The fourth conductor CB4 may include a conductive layer CO and a barrier layer BR. The conductive layer CO and the barrier layer BR may include different materials. The conductive layer CO may include a metal different from a metal included in the barrier layer BR. For example, the conductive layer CO may include copper, tungsten, or aluminum. For example, the barrier layer BR may include titanium, titanium nitride, tantalum, or tantalum nitride.

The barrier layer BR of the fourth conductor CB4 may cover the first channel portions CL1 of the channel layers CL. The barrier layer BR of the fourth conductor CB4 may be in contact with the first channel portions CL1 of the channel layers CL. The conductive layer CO of the fourth conductor CB4 may be spaced apart from the stack STA and the first channel portions CL1 of the channel layers CL with the barrier layer BR of the fourth conductor CB4 interposed therebetween.

A fifth conductor CB5 may be provided on the second stack portion STA2 of the stack STA. The fifth conductor CB5 may be provided in the connection region COR. The fifth conductor CB5 may be in contact with the fourth contacts CT4. The fifth conductor CB5 may include a conductive layer CO and a barrier layer BR. The barrier layer BR of the fifth conductor CB5 may be in contact with the fourth contacts CT4. The conductive layer CO of the fifth conductor CB5 may be spaced apart from the stack STA and the fourth contacts CT4 with the barrier layer BR of the fifth conductor CB5 interposed therebetween.

A fifth insulating layer 150 covering the fourth and fifth conductors CB4 and CB5 may be provided. A portion of the fifth insulating layer 150 may be provided between the fourth and fifth conductors CB4 and CB5. The fourth and fifth conductors CB4 and CB5 may be spaced apart from each other in the first direction D1 by the fifth insulating layer 150. The fourth and fifth conductors CB4 and CB5 may be electrically separated from each other by the fifth insulating layer 150. The fifth insulating layer 150 may include an insulating material. For example, the fifth insulating layer 150 may include oxide.

Fifth contacts CT5 and sixth contacts CT6 may be provided in the fifth insulating layer 150. The fifth contacts CT5 may be in contact with the fourth conductor CB4. The fifth contacts CT5 may be provided in the cell region CER. The fifth contacts CT5 may extend in the third direction D3. A width of the fifth contacts CT5 may decrease as the fifth contacts CT5 close to the stack STA and the peripheral transistor TR.

The sixth contact CT6 may be in contact with the fifth conductor CB5. The sixth contact CT6 may be provided in the connection region COR. The sixth contact CT6 may extend in the third direction D3. A width of the sixth contact CT6 may decrease as the sixth contact CT6 close to the stack STA and the peripheral transistor TR. Each of the fifth and sixth contacts CT5 and CT6 may include a conductive layer and a barrier layer.

A sixth conductor CB6 and a seventh conductor CB7 may be provided in the fifth insulating layer 150. The sixth conductor CB6 may be in contact with the fifth contacts CT5. The sixth conductor CB6 may be provided in the cell region CER. The sixth conductor CB6 may extend in the first direction D1. For example, the sixth conductor CB6 may include aluminum.

The seventh conductor CB7 may be in contact with the sixth contact CT6. The seventh conductor CB7 may be provided in the connection region COR. The seventh conductor CB7 may extend in the first direction D1. For example, the seventh conductor CB7 may include aluminum.

The channel layer CL may be electrically connected to the sixth conductor CB6 through the fourth conductor CB4 and the fifth contact CT5. The peripheral transistor TR in the connection region COR may be electrically connected to the seventh conductor CB7 through the first contact CT1, the first conductor CB1, the third conductor CB3, the second contact CT2, the fourth contact CT4, the fifth conductor CB5, and the sixth contact CT6.

Referring to FIG. 1B, the first channel portion CL1 of the channel layer CL may include a first portion CL1$a$ in the first stack portion STA1 of the stack STA and a second portion CL1$b$ in the fourth conductor CB4. The first portion CL1$a$ of the first channel portion CL1 may be surrounded by the first stack portion STA1 of the stack STA. The second portion CL1$b$ of the first channel portion CL1 may be surrounded by the fourth conductor CB4. A level of a boundary between the first portion CL1$a$ and the second portion CL1$b$ of the first channel portion CL1 may be the same as a level of a boundary between the first stack portion STA1 of the stack STA and the fourth conductor CB4. The second portion CL1$b$ of the first channel portion CL1 may protrude above the first stack portion STA1 of the stack STA. A level of a boundary between the second channel portion CL2 and the first portion CL1$a$ of the first channel portion CL1 may be lower than the boundary between the first stack portion STA1 of the stack STA and the fourth conductor CB4. The second portion CL1$b$ of the first channel portion CL1 may include a first outer wall SW1 and a first upper surface TO1.

The barrier layer BR of the fourth conductor CB4 may include a junction portion BR_C that is in contact with the first channel portion CL1 of the channel layer CL. The junction portion BR_C may surround the first channel portion CL1. The junction portion BR_C may be formed along a surface of the first channel portion CL1. The junction portion BR_C may be in contact with the first outer wall SW1 and the first upper surface TO1 of the second portion CL1b of the first channel portion CL1. The junction portion BR_C may be conformally formed on the first outer wall SW1 and the first upper surface TO1 of the second portion CL1b of the first channel portion CL1. The junction portion BR_C may include a second outer wall SW2 and a second upper surface TO2. The barrier layer BR of the fourth conductor CB4 may include a material different from that of the first channel portion CL1 and the second channel portion CL2 of the channel layer CL.

The conductive layer CO of the fourth conductor CB4 may surround the junction portion BR_C. The conductive layer CO of the fourth conductor CB4 may be in contact with the second outer wall SW2 and the second upper surface TO2 of the junction portion BR_C. The conductive layer CO of the fourth conductor CB4 may include a material different from that of the barrier layer BR of the fourth conductor CB4, the first channel portion CL1, and the second channel portion CL2.

The filling layer FI may include a first filling portion FI1 in the first channel portion CL1 and a second filling portion FI2 in the second channel portion CL2. The first filling portion FI1 may be surrounded by the first channel portion CL1. The second filling portion FI2 may be surrounded by the second channel portion CL2. A width of the first filling portion FI1 may be less than a width of the second filling portion FI2. The width of the first filling portion FI1 in the first direction D1 may be less than a width of the second filling portion FI2 in the first direction D1.

A lower surface of the conductive layer CO of the fourth conductor CB4 may be depressed to define a first recess RC1. A space defined by the first recess RC1 may have a cylindrical shape with an uneven width. The first recess RC1 may be filled with the junction portion BR_C, the first channel portion CL1, and the first filling portion FI1. The junction portion BR_C, the first channel portion CL1, and the first filling portion FI1 may be disposed in the first recess RC1.

In the semiconductor device according to an embodiment of the present disclosure, since the first channel portion CL1 of the channel layer CL is formed of metal silicide and the second channel portion CL2 is formed of polysilicon, an ohmic contact may be formed between the first channel portion CL1 and the second channel portion CL2. Accordingly, an ohmic contact is not required to be formed between the first channel portion CL1 and the barrier layer BR of the fourth conductor CB4, and thus the barrier layer BR of the fourth conductor CB4 may be directly formed on the first channel portion CL1 without a high-temperature thermal process.

In the semiconductor device according to an embodiment of the present disclosure, since the first channel portion CL1 used as a junction overlap region of the channel layer CL is formed of metal silicide, the junction overlap region of the channel layer CL may be formed without a high-temperature thermal process, and a characteristic of the select transistor may be prevented from being changed due to deterioration of the select transistor by a high-temperature thermal process.

In the semiconductor device according to an embodiment of the present disclosure, the first channel portion CL1 used as the junction overlap region of the channel layer CL is formed of metal silicide. Thus, a grain boundary in the first channel portion CL1 may be relatively small compared to a grain boundary in a channel layer formed of polysilicon. In addition, the first channel portion CL1 may be formed to have a uniform thickness. Accordingly, a level of a boundary between the first channel portion CL1 and the second channel portion CL2 may be uniformly formed. The level of the boundary between the first channel portion CL1 and the second channel portion CL2 may be formed so that the boundary between the first channel portion CL1 and the second channel portion CL2 does not horizontally overlap the select line while the boundary between the first channel portion CL1 and the second channel portion CL2 is adjacent to the select line. Accordingly, since a distance between the select line and the first channel portion CL1 may be uniform, a relatively uniform cell current may be generated, and the characteristic of the select transistor may be uniform.

FIGS. 2, 3, 4, 5, 6, 7, 8, 9, 10A, 11A, 12A, 13A, 14A, and 15 are cross-sectional views illustrating a method of manufacturing the semiconductor device according to FIGS. 1A and 1B. FIG. 10B is an enlarged view of a region B of FIG. 10A. FIG. 11B is an enlarged view of a region C of FIG. 11A. FIG. 12B is an enlarged view of a region D of FIG. 12A. FIG. 13B is an enlarged view of a region E of FIG. 13A. FIG. 14B is an enlarged view of a region F of FIG. 14A.

For brief description, the same reference numerals are used for components described with reference to FIGS. 1A and 1B, and a repetitive description is omitted.

The manufacturing method described below is only one embodiment of the method of manufacturing the semiconductor device according to FIGS. 1A and 1B, and the method of manufacturing the semiconductor device according to FIGS. 1A and 1B is not limited to the manufacturing method described below.

Figure 2:
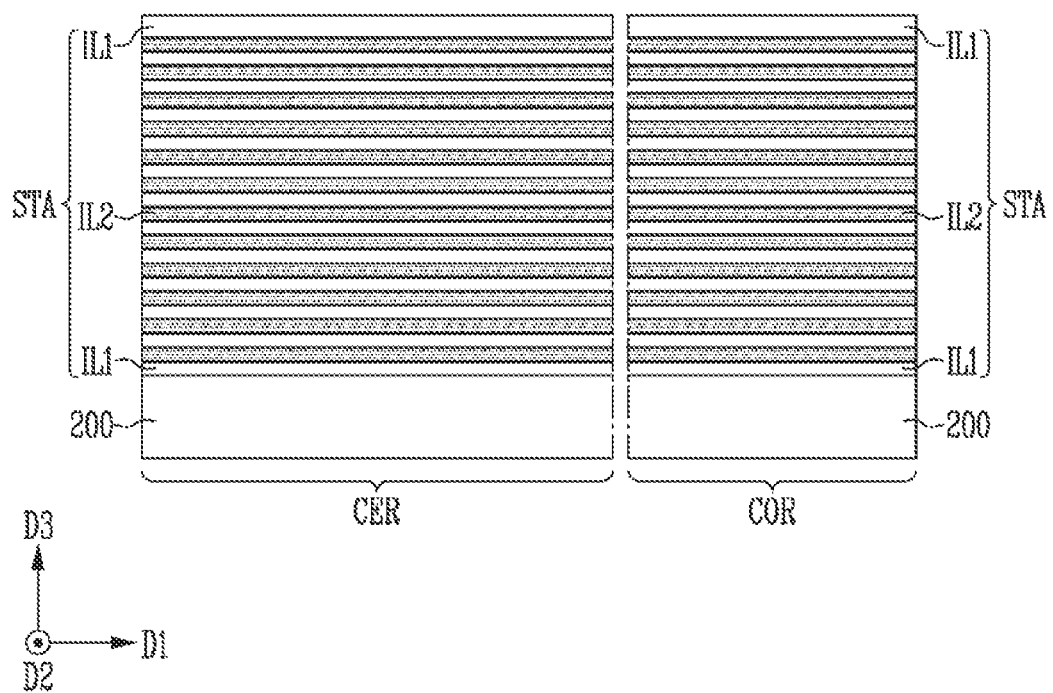
FIGS. 2, 3, 4, 5, 6, 7, 8, 9, 10A, 11A, 12A, 13A, 14A, and 15 are cross-sectional views illustrating a method of manufacturing the semiconductor device according to FIGS. 1A and 1B.

Referring to FIG. 2, a support structure 200 may be formed. The support structure 200 may have a shape of a plate expanding along a plane defined by the first direction D1 and the second direction D2. The support structure 200 may include a material having an etch selectivity for oxide and nitride. For example, the support structure 200 may include silicon.

The stack STA may be formed on the support structure 200. The stack STA may include first stack insulating layers IL1 and second stack insulating layers IL2 alternately stacked in the third direction D3. The first stack insulating layers IL1 may include an insulating material. For example, the first stack insulating layers IL1 may include oxide. The second stack insulating layers IL2 may include a material different from that of the first stack insulating layers IL1. For example, the second stack insulating layers IL2 may include nitride.

Figure 3:
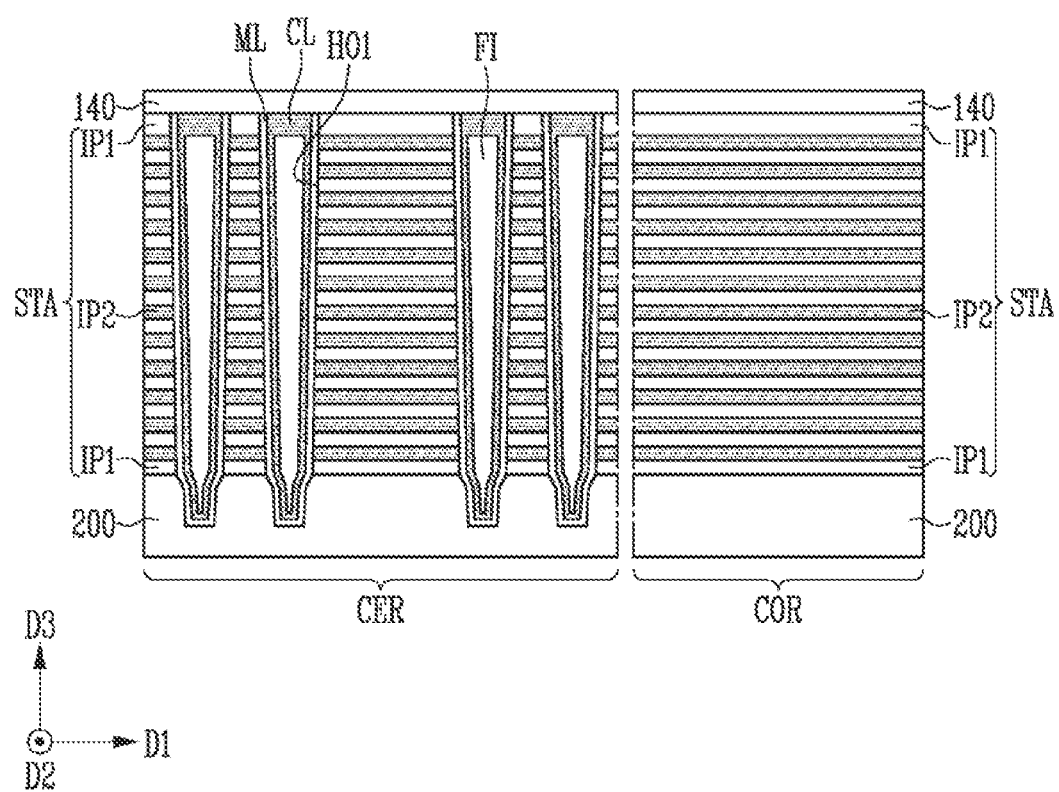

Referring to FIG. 3, the memory layers ML, the channel layers CL, and the filling layers FI passing through the stack STA in the cell region CER may be formed. Forming the memory layers ML, the channel layers CL, and the filling layers FI may include forming first holes HO1 passing through the stack STA in the cell region CER, and forming the memory layers ML, the channel layers CL, and the filling layers FI in the first holes HO1.

As the first holes HO1 passing through the stack STA are formed, the first stack insulating layers IL1 and the second stack insulating layers IL2 may be patterned. The patterned first stack insulating layers IL1 and second stack insulating layers IL2 may be defined as the first insulating patterns IP1 and the second insulating patterns IP2.

The lowermost portion of the first hole HO1 may be provided in the support structure 200. The lowermost portion of the first hole HO1 may be surrounded by the support structure 200. A portion of each of the memory layer ML, the channel layer CL, and the filling layer FI may be provided in the support structure 200. The portion of each of the memory layer ML, the channel layer CL, and the filling layer FI may be surrounded by the support structure 200.

Subsequently, the fourth insulating layer 140 may be formed on the stack STA. The fourth insulating layer 140 may cover the memory layers ML and the channel layers CL.

Figure 4:
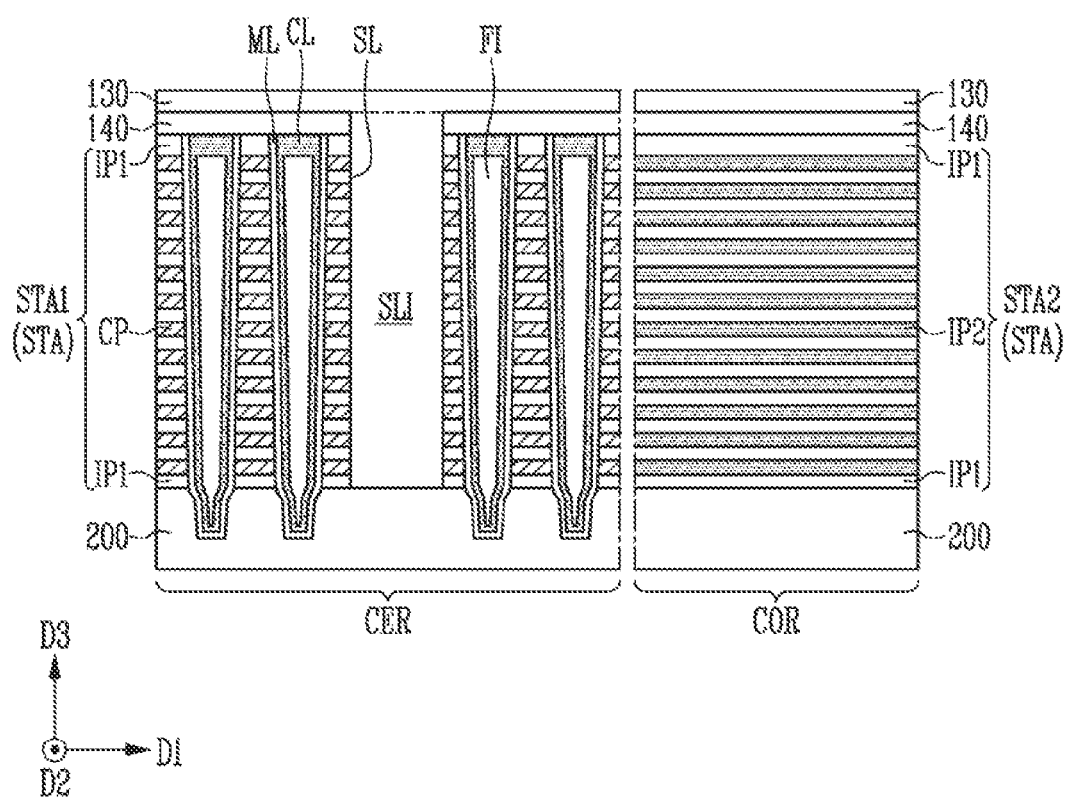

Referring to FIG. 4, the second insulating patterns IP2 in the cell region CER may be replaced with the conductive patterns CP, and the slit insulating layer SLI and the third insulating layer 130 may be formed.

For example, the slit SL passing through the stack STA in the cell region CER may be formed, and the second insulating patterns IP2 exposed through the slit SL may be removed. The conductive patterns CP may be formed in an empty space from which the second insulating patterns IP2 are removed.

The second insulating patterns IP2 in the connection region COR might not be replaced with the conductive patterns CP and may remain. A portion of the stack STA including the conductive patterns CP and the first insulating patterns IP1 may be defined as the first stack portion STA1. A portion of the stack STA including the first insulating patterns IP1 and the second insulating patterns IP2 may be defined as the second stack portion STA2.

After the conductive patterns CP are formed, the slit insulating layer SLI and the third insulating layer 130 may be formed. The slit insulating layer SLI and the third insulating layer 130 may be simultaneously formed by depositing one deposition material. After the slit insulating layer SLI and the third insulating layer 130 are formed, an upper surface of the third insulating layer 130 may be polished.

Figure 5:
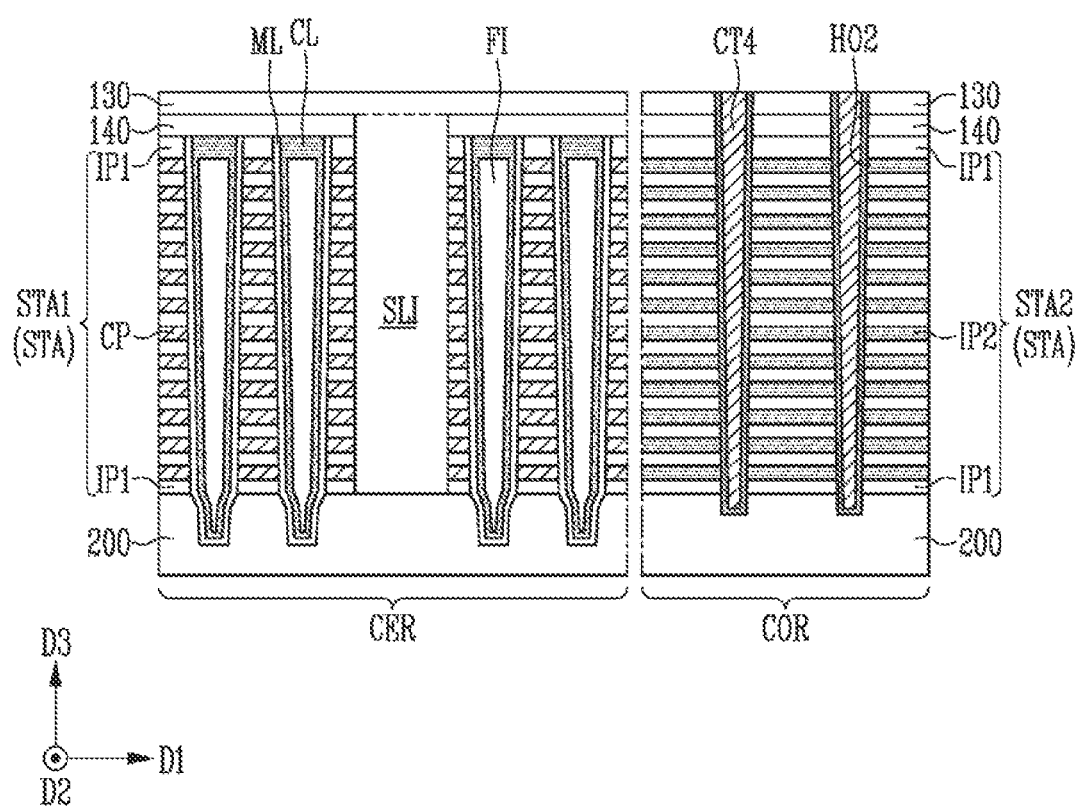

Referring to FIG. 5, the fourth contacts CT4 passing through the second stack portion STA2 of the stack STA, the fourth insulating layer 140, and the third insulating layer 130 may be formed. Forming the fourth contacts CT4 may include forming second holes HO2 passing through the second stack portion STA2 of the stack STA, the fourth insulating layer 140, and the third insulating layer 130, and forming the fourth contacts CT4 in the second holes HO2. The lowermost portion of the second hole HO2 may be provided in the support structure 200. The lowermost portion of the second hole HO2 may be surrounded by the support structure 200. A portion of the fourth contact CT4 may be provided in the support structure 200. The portion of the fourth contact CT4 may be surrounded by the support structure 200.

Figure 6:
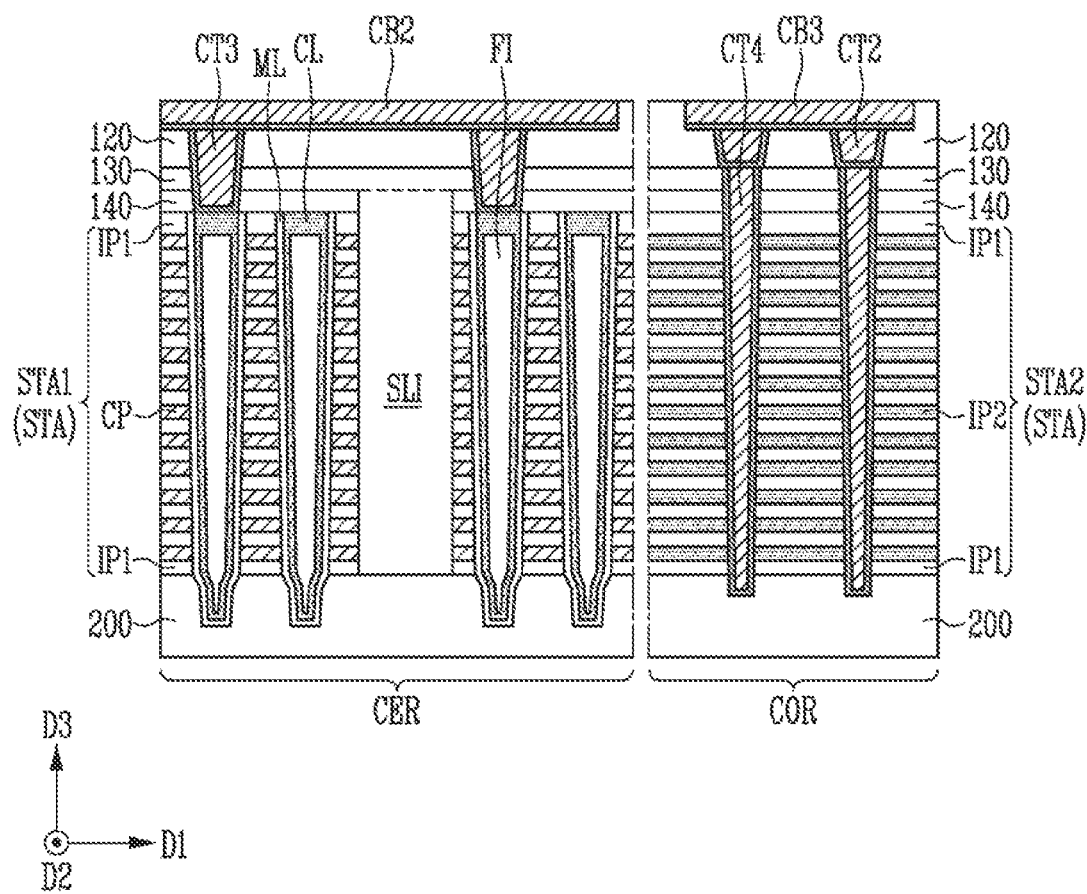

Referring to FIG. 6, the second insulating layer 120 may be formed on the third insulating layer 130. The second contact CT2 connected to the fourth contact CT4 and the third contact CT3 connected to the channel layer CL may be formed. The third conductor CB3 connected to the second contact CT2 and the second conductor CB2 connected to the third contact CT3 may be formed.

Figure 7:
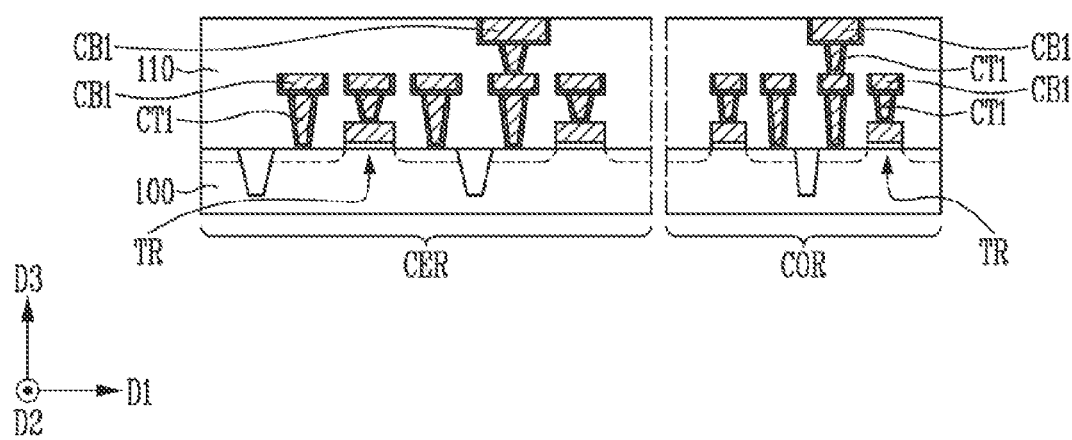

Referring to FIG. 7, the peripheral transistors TR, the first insulating layer 110, the first contacts CT1, and the first conductors CB1 may be formed on the substrate 100.

Figure 8:
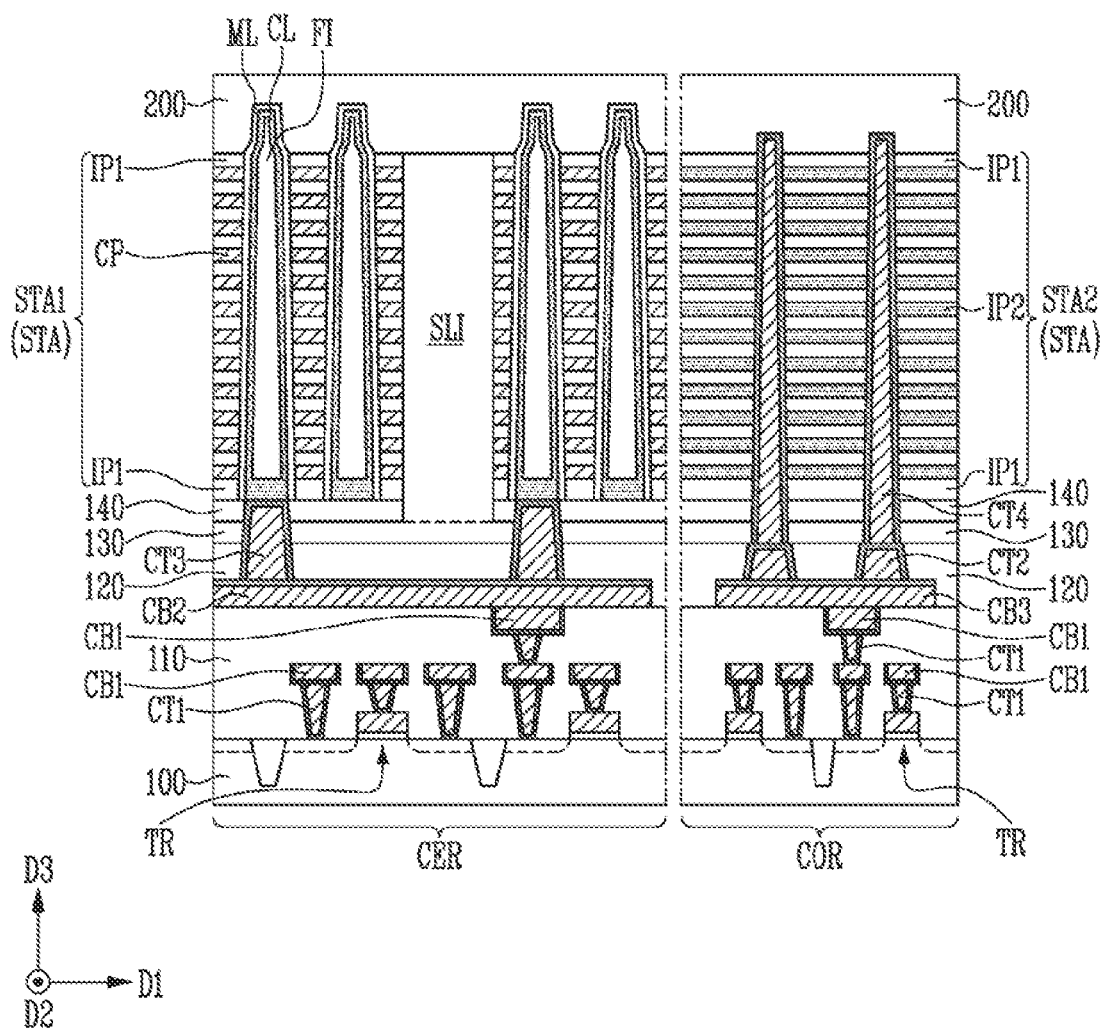

Referring to FIG. 8, a wafer bonding process may be performed. The wafer bonding process may include inverting the support structure 200, bonding the second conductor CB2 and the first conductor CB1 in the cell region CER, bonding the third conductor CB3 and the first conductor CB1 in the connection region COR, and bonding the first insulating layer 110 and the second insulating layer 120. As the second conductor CB2 and the first conductor CB1 in the cell region CER are bonded, the channel layer CL may be electrically connected to the peripheral transistor TR.

Figure 9:
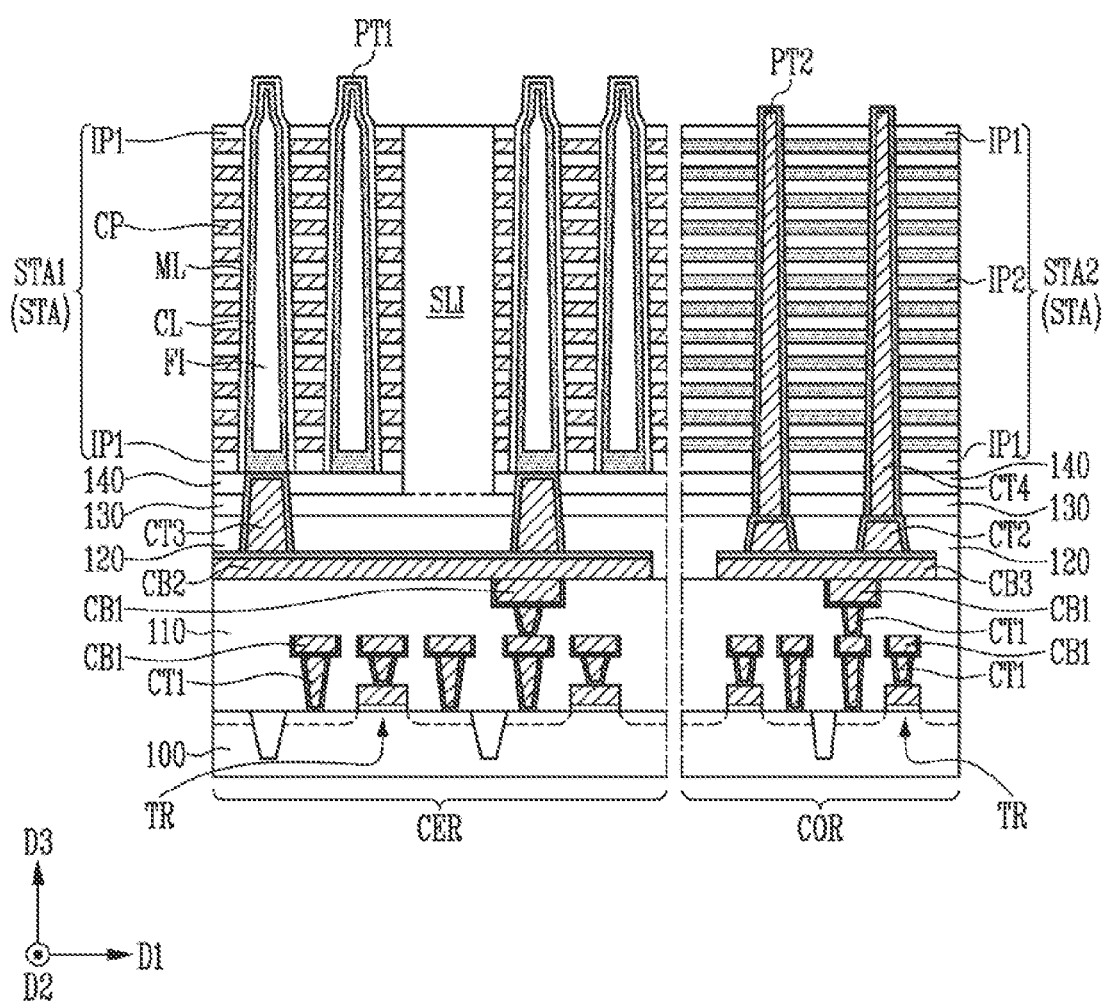

Referring to FIG. 9, the support structure 200 may be removed. As the support structure 200 is inverted in the wafer bonding process, the support structure 200 may be exposed, and the support structure 200 may be removed through an etching process. The support structure 200 may be selectively removed by using an etching material capable of selectively etching the support structure 200.

As the support structure 200 is removed, a first protrusion PT1 of the memory layer ML may be exposed. The first protrusion PT1 of the memory layer ML may be a portion protruding above the first stack portion STA1 of the stack STA. As the support structure 200 is removed, an upper surface and an outer wall of the first protrusion PT1 of the memory layer ML may be exposed. As the support structure 200 is removed, a second protrusion PT2 of the fourth contact CT4 may be exposed. The second protrusion PT2 of the fourth contact CT4 may be a portion protruding above the second stack portion STA2 of the stack STA. As the support structure 200 is removed, an upper surface and an outer wall of the second protrusion PT2 of the fourth contact CT4 may be exposed.

Figure 10A:
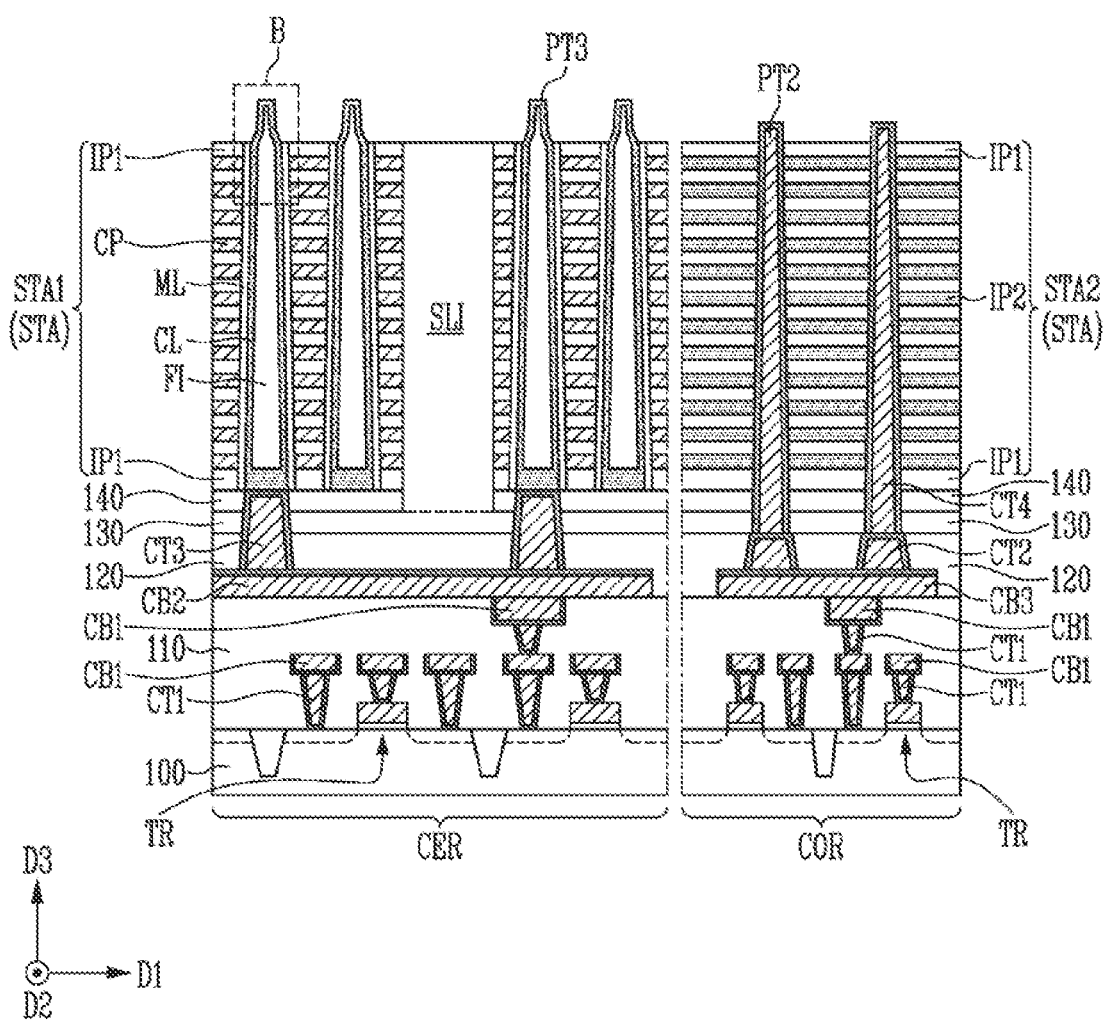
Figure 10B:
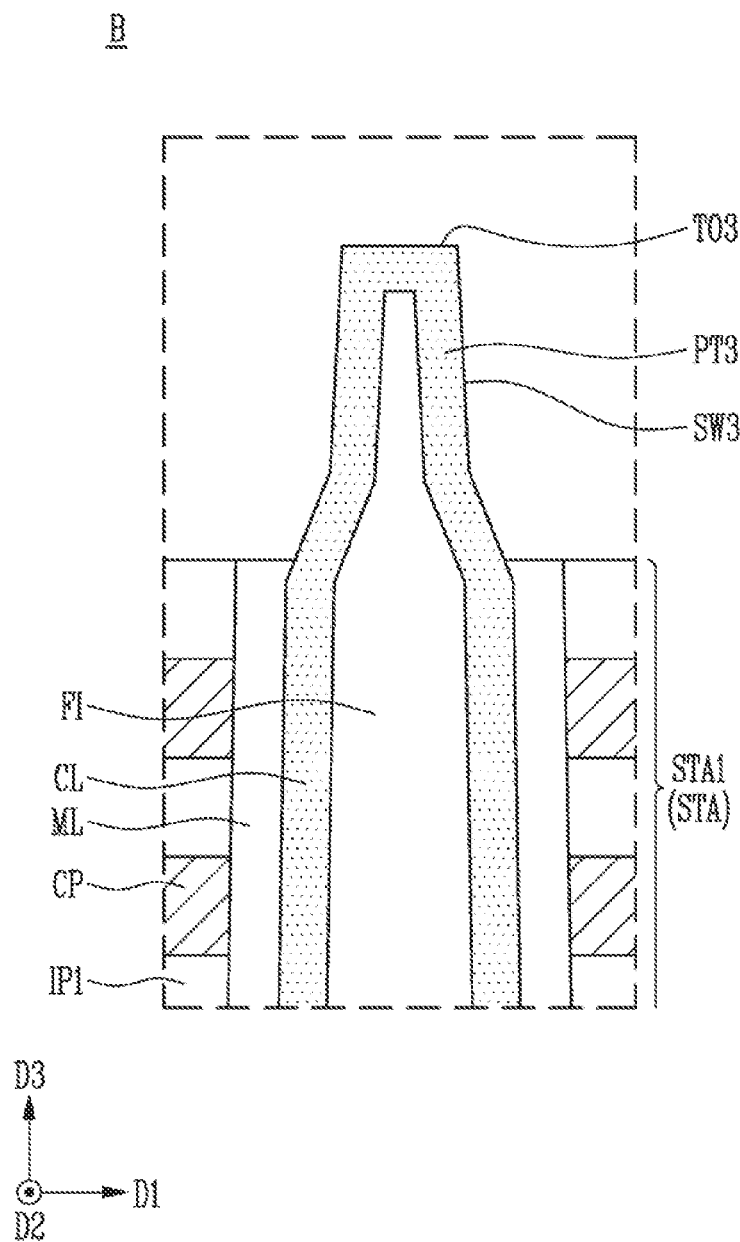
FIG. 10B is an enlarged view of a region B of FIG. 10A.

Referring to FIGS. 10A and 10B, the first protrusion PT1 of the memory layer ML protruding above the first stack portion STA1 of the stack STA may be removed. Removing the first protrusion PT1 of the memory layer ML may include sequentially removing a portion of the blocking layer, a portion of the data storage layer, and a portion of the tunnel insulating layer. The first protrusion PT1 of the memory layer ML is removed, and thus a third protrusion PT3 of the channel layer CL may be exposed. The third protrusion PT3 of the channel layer CL may be a portion protruding above the first stack portion STA1 of the stack STA. The first protrusion PT1 of the memory layer ML is removed, and thus an upper surface and an outer wall of the third protrusion PT3 of the channel layer CL may be exposed. The exposed outer wall of the third protrusion PT3 may be defined as a third outer wall SW3, and the exposed upper surface of the third protrusion PT3 may be defined as a third upper surface TO3. The third protrusion PT3 of the channel layer CL may be a portion positioned at a level higher than that of the first stack portion STA1 of the stack STA. The third protrusion PT3 of the channel layer CL may be disposed at a level higher than that of the memory layer ML from which the first protrusion PT1 is removed.

Figure 11A:
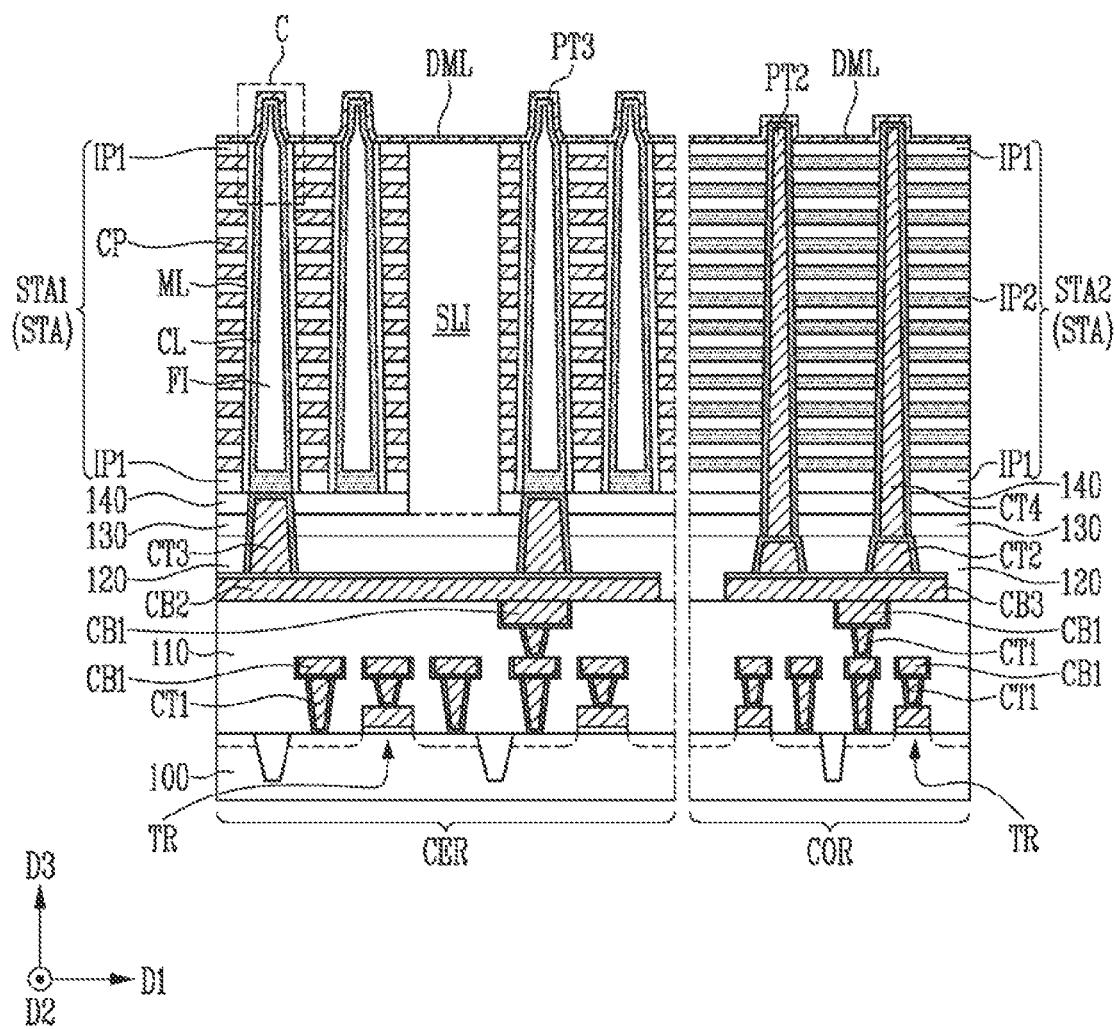
Figure 11B:
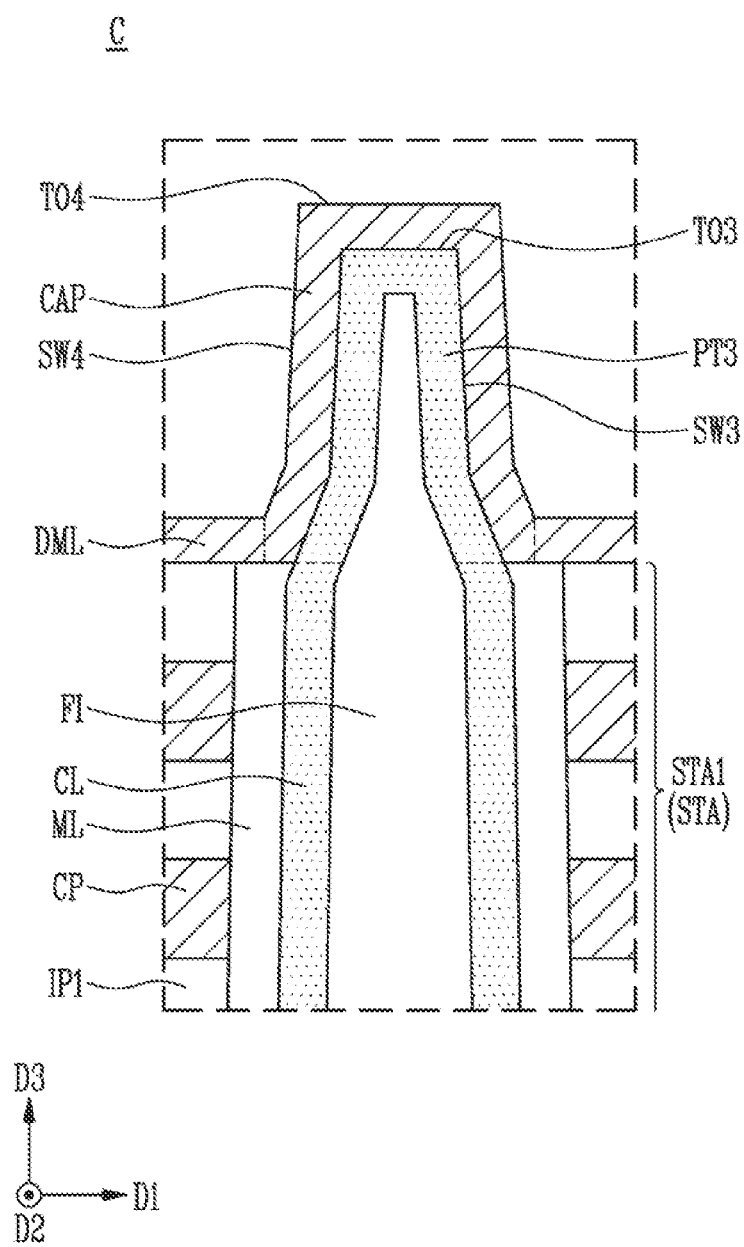
FIG. 11B is an enlarged view of a region C of FIG. 11A.

Referring to FIGS. 11A and 11B, a diffusion metal layer DML may be formed on the stack STA. The diffusion metal layer DML may include a metallic material. For example, the diffusion metal layer DML may include nickel platinum. For example, composition of nickel platinum included in the diffusion metal layer DML may be NiPt. The diffusion metal layer DML may include an element that may be diffused into the channel layer CL. For example, the diffusion metal layer DML may include nickel that may be diffused into the channel layer CL. The diffusion metal layer DML may be conformally formed on the stack STA. The diffusion metal layer DML may cover the first stack portion STA1 and the second stack portion STA2 of the stack STA. The diffusion metal layer DML may cover the third protrusions PT3 and the second protrusions PT2. The diffusion metal layer DML may be formed by a deposition process. The diffusion metal layer DML may be in contact with the third protrusions PT3 and the second protrusions PT2.

The diffusion metal layer DML may include capping portions CAP surrounding the third protrusions PT3 of the channel layers CL. The capping portion CAP may be a portion of the diffusion metal layer DML that is in contact with the third outer wall SW3 and the third upper surface TO3 of the third protrusion PT3 of the channel layer CL. The capping portion CAP may be formed along the third outer wall SW3 and the third upper surface TO3 of the third protrusion PT3 of the channel layer CL, and thus the capping portion CAP may have a shape corresponding to the third protrusion PT3 of the channel layer CL. An outer wall of the capping portion CAP may be defined as a fourth outer wall SW4, and an upper surface of the capping portion CAP may be defined as a fourth upper surface TO4.

Figure 12A:
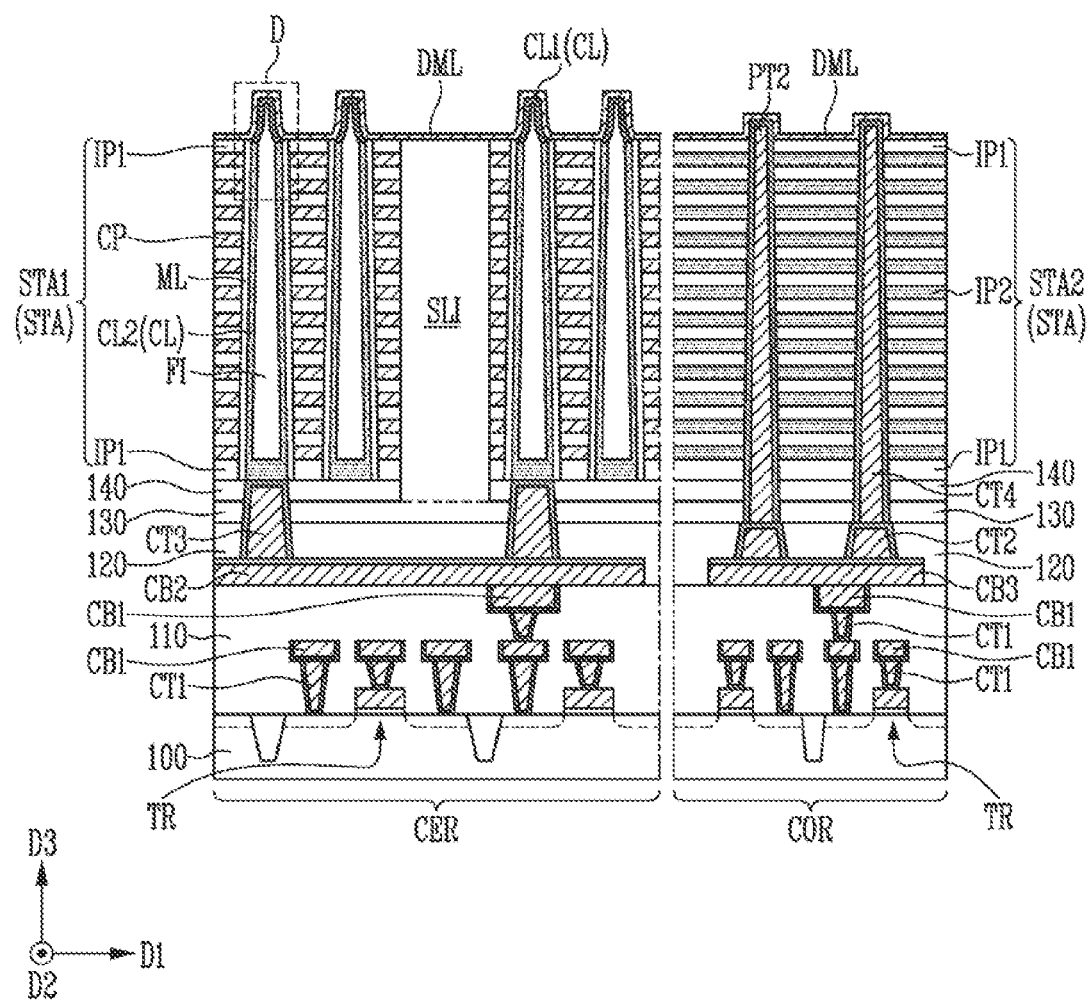
Figure 12B:
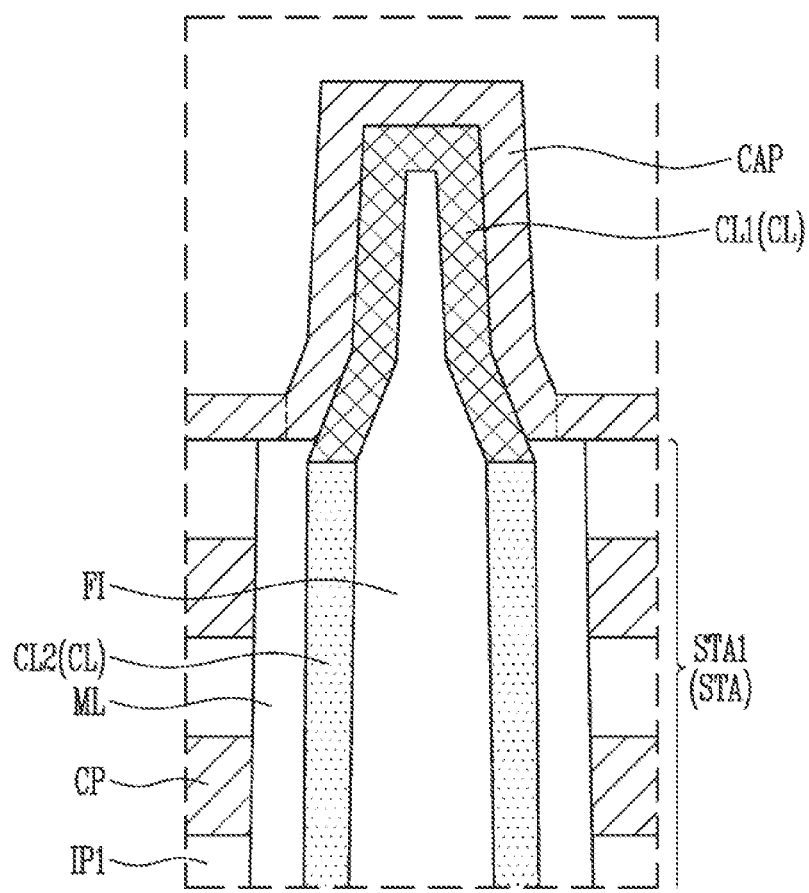
FIG. 12B is an enlarged view of a region D of FIG. 12A.

Referring to FIGS. 12A and 12B, the first channel portion CL1 of the channel layer CL may be formed. Composition of a portion of the channel layer CL may be changed, and thus the first channel portion CL1 may be formed. Compositions of the third protrusion PT3 of the channel layer CL and a portion adjacent to the third protrusion PT3 may be changed, and thus the first channel portion CL1 may be formed. A portion of the channel layer CL except for the first channel portion CL1 may be defined as the second channel portion CL2.

The first channel portion CL1 may be formed by a thermal process. For example, the first channel portion CL1 may be formed by a rapid thermal annealing (RTA) process. The thermal process may be performed at a temperature of 290° C. to 450° C.

An element included in the diffusion metal layer DML may be diffused into the third protrusion PT3 of the channel layer CL by the thermal process, and the first channel portion CL1 may be formed. For example, nickel included in the diffusion metal layer DML may be diffused into the channel layer CL by the thermal process. For example, the nickel diffused into the channel layer CL may be combined with silicon in the channel layer CL, and the first channel portion CL1 formed in this method may include nickel silicide. For example, composition of nickel silicide included in the first channel portion CL1 may be NiSi. The first channel portion CL1 and the second channel portion CL2 may form an ohmic contact. The level of the boundary between the second channel portion CL2 and the first channel portion CL1 may be disposed adjacent to the uppermost conductive pattern CP used as the select line. The level of the boundary between the second channel portion CL2 and the first channel portion CL1 may be disposed at a level lower than an upper surface of the stack STA.

A volume of a portion of the channel layer CL may be increased while composition is changed. Accordingly, the first channel portion CL1 may be formed to have a volume greater than that of the third protrusion PT3. For example, a width of the first channel portion CL1 in the first direction D1 may be greater than a width of the third protrusion PT3 in the first direction D1, and a length of the first channel portion CL1 in the third direction D3 may be greater than a length of the third protrusion PT3 in the third direction D3. For example, a thickness of the first channel portion CL1 in the first direction D1 may be greater than a thickness of the second channel portion CL2 in the first direction D1.

Figure 13A:
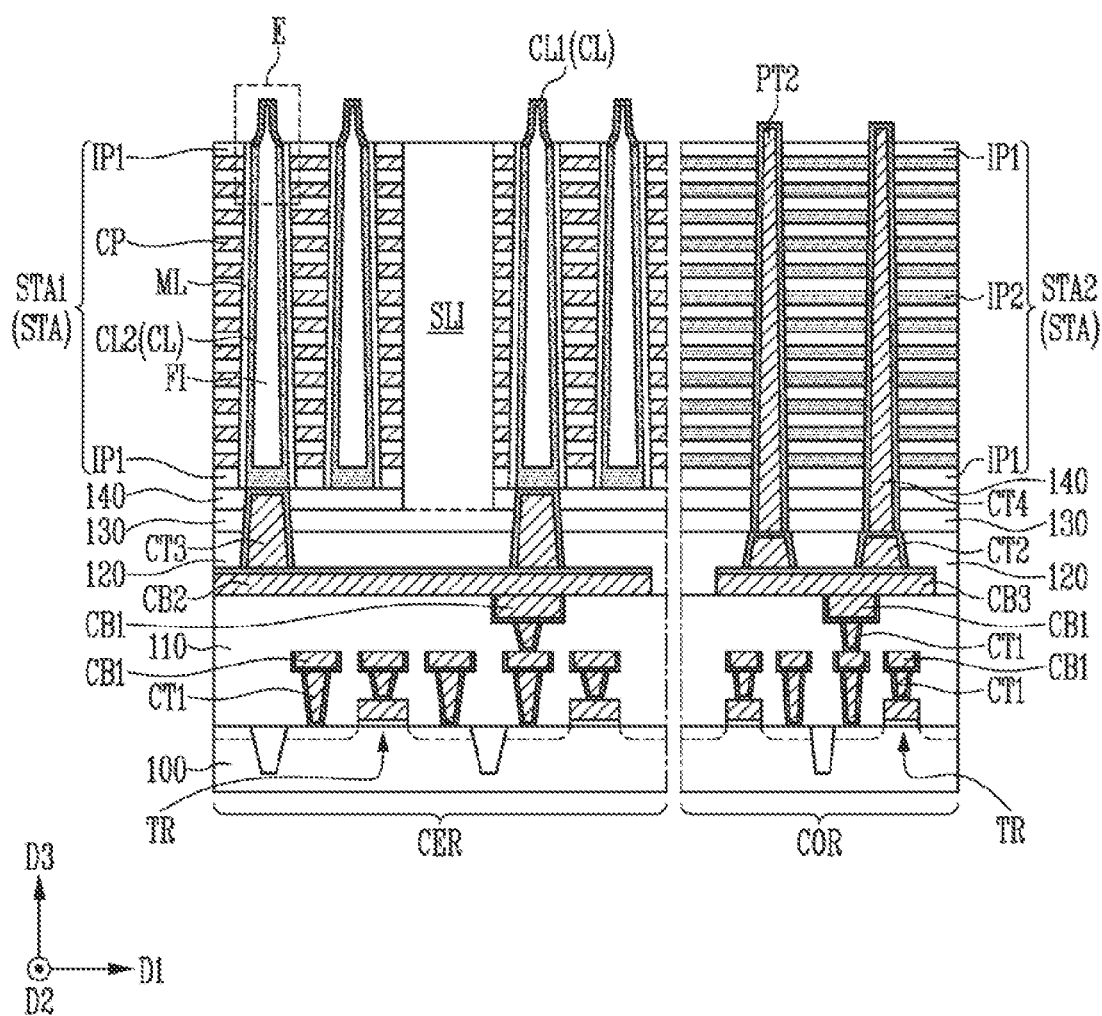
Figure 13B:
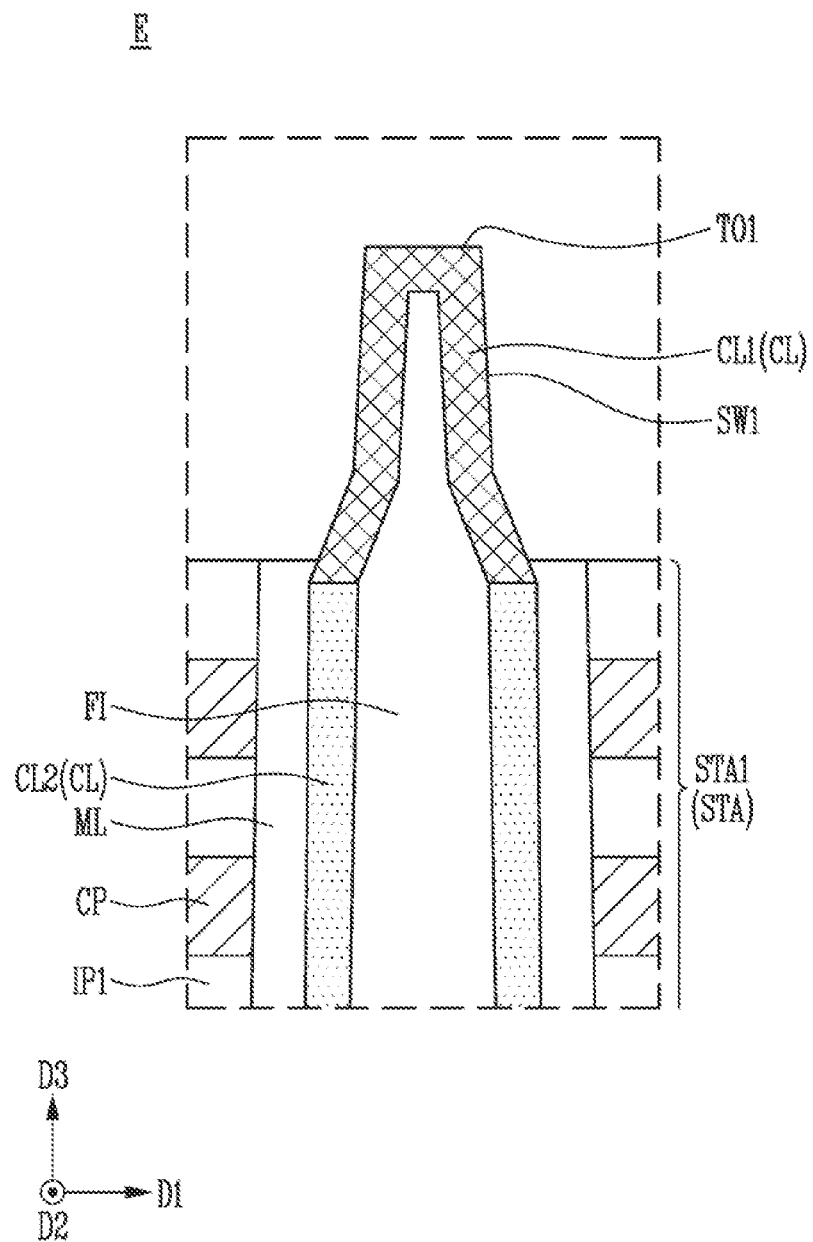
FIG. 13B is an enlarged view of a region E of FIG. 13A.

Referring to FIGS. 13A and 13B, the diffusion metal layer DML may be removed. As the diffusion metal layer DML is removed, the first channel portion CL1 of the channel layer CL may be exposed, and the second protrusion PT2 of the fourth contact CT2 may be exposed. As the diffusion metal layer DML is removed, the first outer wall SW1 and the first upper surface TO1 of the first channel portion CL1 of the channel layer CL may be exposed. For example, the diffusion metal layer DML may be removed by a wet etching process.

Figure 14A:
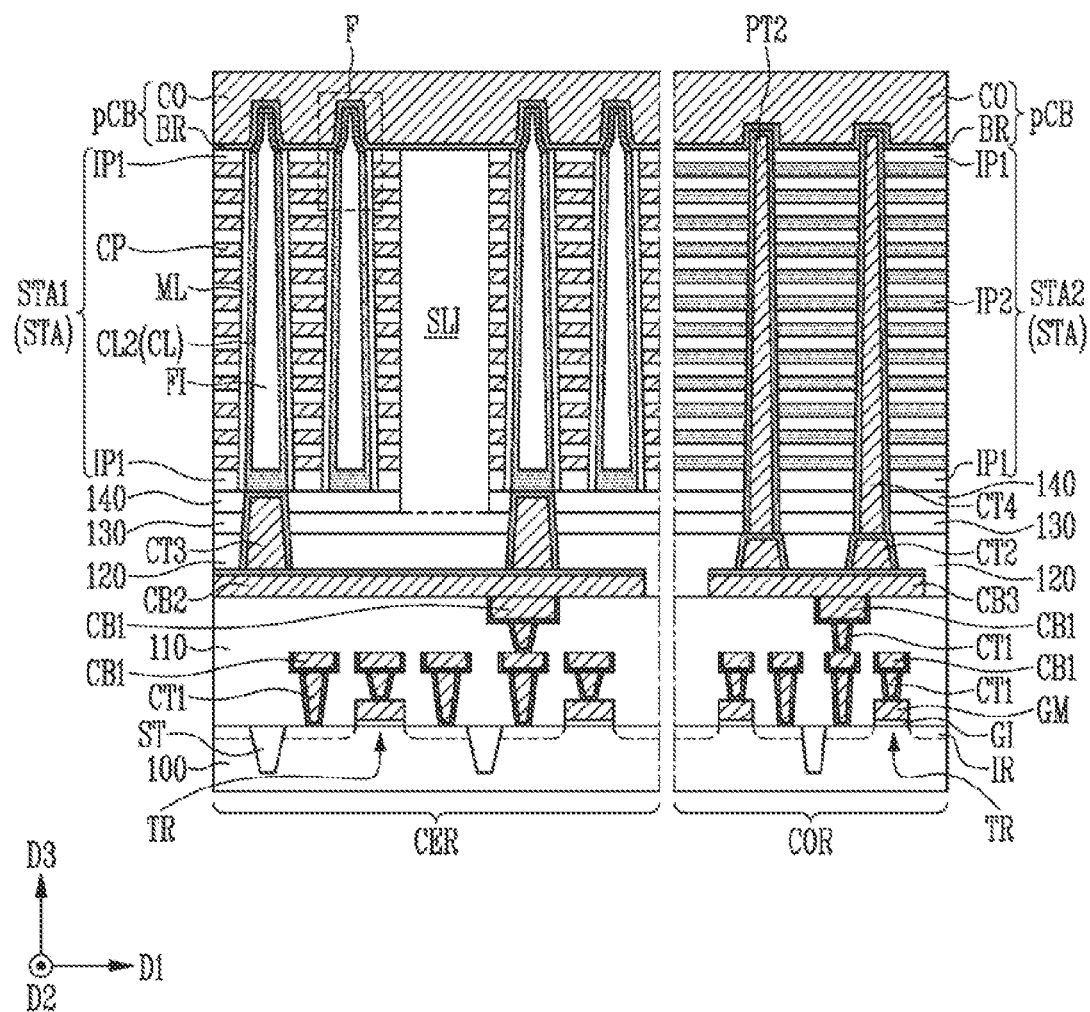
Figure 14B:
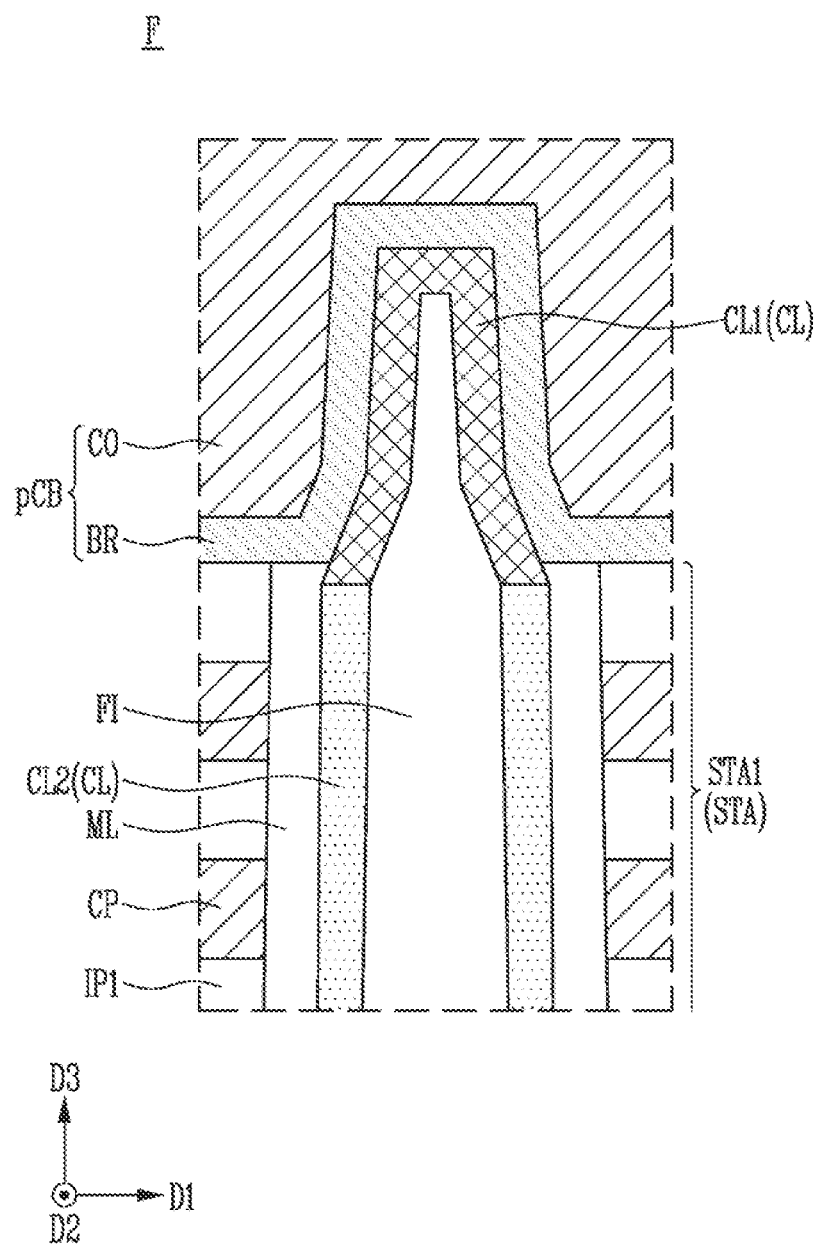
FIG. 14B is an enlarged view of a region F of FIG. 14A.

Referring to FIGS. 14A and 14B, a preliminary conductor pCB may be formed on the stack STA. The preliminary conductor pCB may cover the first stack portion STA1 and the second stack portion STA2 of the stack STA. The preliminary conductor pCB may cover the first channel portions CL1 of the channel layers CL and the second protrusions PT2 of the fourth contacts CT4. The preliminary conductor pCB may include a barrier layer BR covering the stack STA and a conductive layer CO covering the barrier layer BR. The barrier layer BR of the preliminary conductor pCB may cover the first upper surface TO1 and the first outer wall SW1 of the first channel portion CL1 of the channel layer CL. Forming the preliminary conductor pCB may include forming the barrier layer BR on the stack STA, and forming the conductive layer CO on the barrier layer BR.

Figure 15:
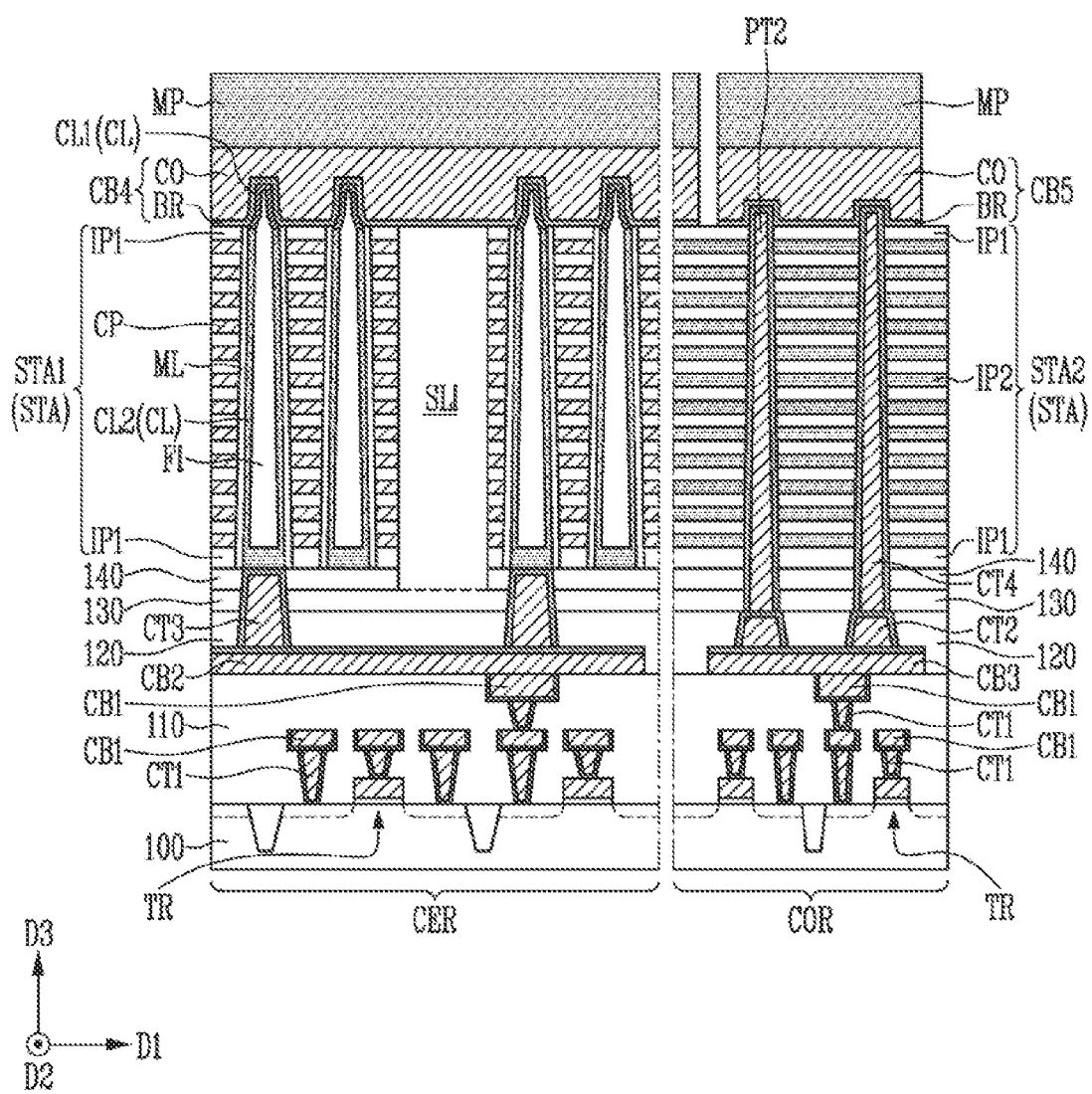

Referring to FIG. 15, the fourth conductor CB4 and the fifth conductor CB5 may be formed. The preliminary conductor pCB may be separated, and thus the fourth conductor CB4 and the fifth conductor CB5 may be formed. Forming the fourth conductor CB4 and the fifth conductor CB5 may include forming a mask pattern MP including an opening on the preliminary conductor pCB, and etching the preliminary conductor pCB by using the mask pattern MP as an etching barrier. After the preliminary conductor pCB is etched, the remaining mask pattern MP may be removed.

Subsequently, the fifth insulating layer 150 (refer to FIG. 1A) covering the fourth conductor CB4 and the fifth conductor CB5 may be formed. Subsequently, the fifth contacts CT5 (refer to FIG. 1A) and the sixth conductor CB6 (refer to FIG. 1A) connected to the fourth conductor CB4 may be formed in the fifth insulating layer 150, and the sixth contact CT6 (refer to FIG. 1A) and the seventh conductor CB7 (refer to FIG. 1A) connected to the fifth conductor CB5 may be formed.

In the method of manufacturing the semiconductor device according to an embodiment of the present disclosure, since the first channel portion CL1 of the channel layer CL is formed of metal silicide and the second channel portion CL2 is formed of polysilicon, an ohmic contact may be formed between the first channel portion CL1 and the second channel portion CL2. Accordingly, an ohmic contact is not required to be formed between the first channel portion CL1 and the barrier layer BR of the fourth conductor CB4, and thus the barrier layer BR of the fourth conductor CB4 may be directly formed on the first channel portion CL1 without a high-temperature thermal process.

In the method of manufacturing the semiconductor device according to an embodiment of the present disclosure, since the first channel portion CL1 formed of metal silicide may be formed without a high-temperature thermal process, a characteristic of the select transistor may be prevented from being changed due to deterioration of the select transistor by a high-temperature thermal process.

In the method of manufacturing the semiconductor device according to an embodiment of the present disclosure, the level of the boundary between the first channel portion CL1 and the second channel portion CL2 may be adjusted by adjusting a formation condition of the first channel portion CL1. The level of the boundary between the first channel portion CL1 and the second channel portion CL2 may be adjusted by adjusting a temperature of the thermal process, adjusting a time during which the thermal process is performed, adjusting composition of a material included in the metal diffusion layer DML, or adjusting a thickness of the metal diffusion layer DML. As the first channel portion CL1 is formed of metal silicide, a grain boundary in the first channel portion CL1 may be relatively small compared to a grain boundary in a channel layer formed of polysilicon. In addition, the first channel portion CL1 may be formed to have a uniform thickness. Accordingly, the level of the boundary between the first channel portion CL1 and the second channel portion CL2 may be uniformly formed. The level of the boundary between the first channel portion CL1 and the second channel portion CL2 may be formed so that the boundary between the first channel portion CL1 and the second channel portion CL2 does not horizontally overlap the select line while the boundary between the first channel portion CL1 and the second channel portion CL2 is adjacent to the select line. Accordingly, since a distance between the select line and the first channel portion CL1 may be uniform, a relatively uniform cell current may be generated, and the characteristic of the select transistor may be uniform.

In the method of manufacturing the semiconductor device according to an embodiment of the present disclosure, metal in the diffusion metal layer DML may be diffused into the channel layer CL, and may be combined with the silicon of the channel layer CL in 1:1. As the metal and the silicon are combined in 1:1 not 1:2 or 1:3, it is possible to prevent a phenomenon that silicon is aggregated around the metal. In conclusion, the silicon of the second channel portion CL2 formed of the polysilicon may move to the first channel portion CL1 formed of the metal silicide, and thus a phenomenon that the first channel portion CL1 and the second channel portion CL2 are separated from each other may be prevented.

Figure 16:
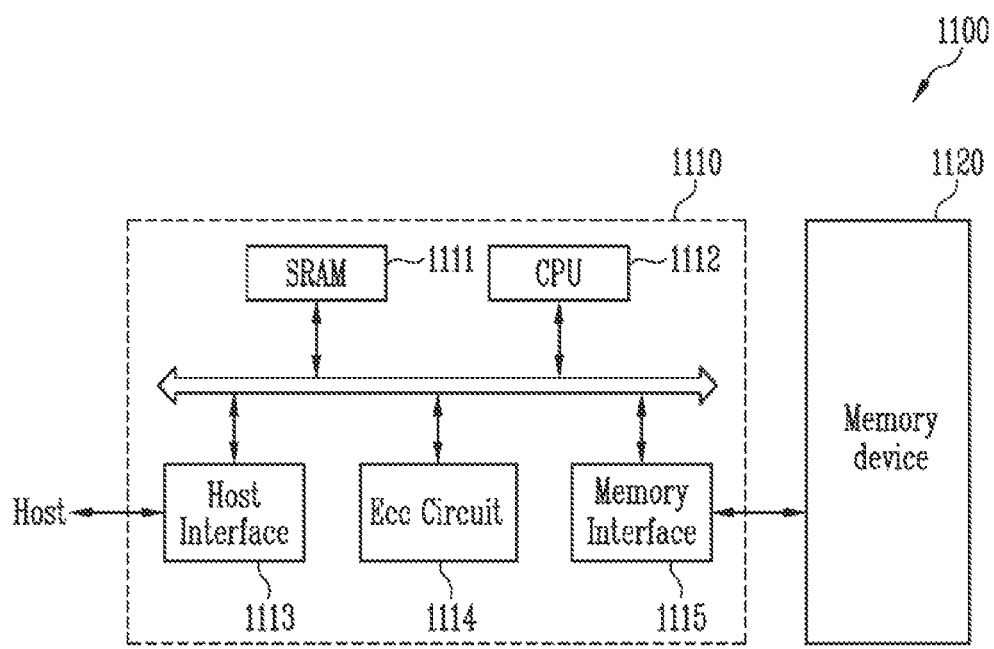
FIG. 16 is a block diagram illustrating a configuration of a memory system according to an embodiment of the present disclosure.

FIG. 16 is a block diagram illustrating a configuration of a memory system according to an embodiment of the present disclosure.

Referring to FIG. 16, the memory system 1100 according to an embodiment of the present disclosure includes a memory device 1120 and a memory controller 1110.

The memory device 1120 may include the semiconductor devices according to an embodiment of the present disclosure. The memory device 1120 may be a multi-chip package configured of a plurality of flash memory chips.

The memory controller 1110 may be configured to control the memory device 1120, and may include a static random access memory (SRAM) 1111, a central processing unit (CPU) 1112, a host interface 1113, an error correction code (ECC) circuit 1114, and a memory interface 1115. The SRAM 1111 is used as an operation memory of the CPU 1112, the CPU 1112 performs an overall control operation for data exchange of the memory controller 1110, and the host interface 1113 includes a data exchange protocol of a host that is connected to the memory system 1100. In addition, the ECC circuit 1114 detects and corrects an error included in data read from the memory device 1120, and the memory interface 1115 performs an interfacing with the memory device 1120. In addition, the memory controller 1110 may further include a read only memory (ROM) or the like that stores code data for interfacing with the host.

The memory system 1100 described above may be a memory card or a solid state disk (SSD) in which the memory device 1120 and the memory controller 1110 are combined to each other. For example, when the memory system 1100 is the SSD, the memory controller 1110 may communicate with the outside (for example, the host) through at least one of various interface protocols such as a universal serial bus (USB), a multimedia card (MMC), a peripheral component interconnection-express (PCI-E), a serial advanced technology attachment (SATA), a parallel advanced technology attachment (PATA), a small computer system interface (SCSI), an enhanced small disk interface (ESDI), and integrated drive electronics (IDE).

Figure 17:
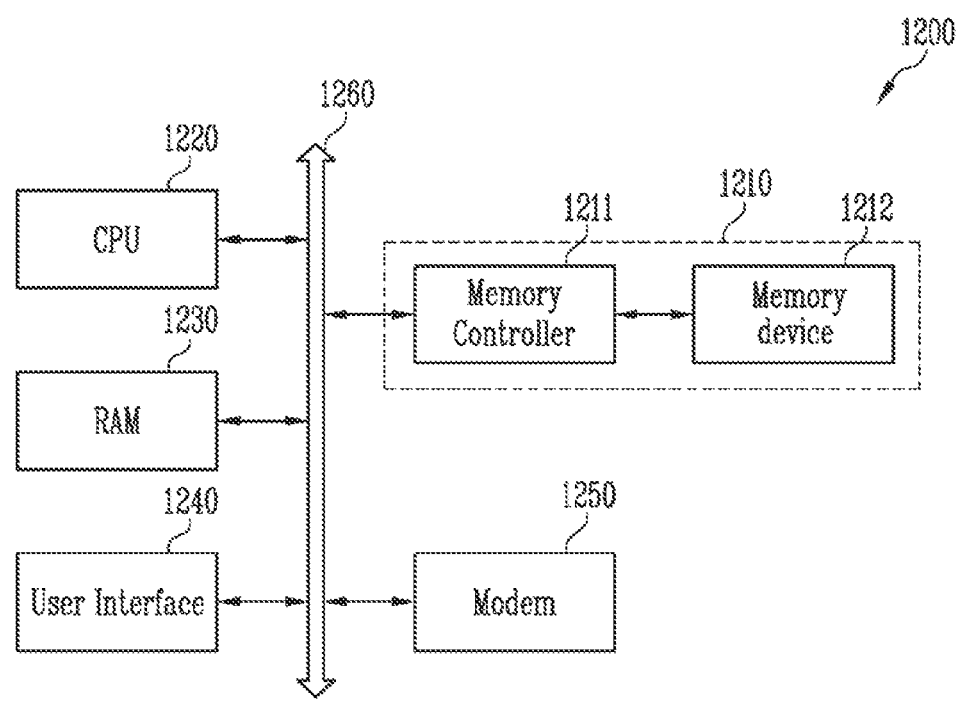
FIG. 17 is a block diagram illustrating a configuration of a computing system according to an embodiment of the present disclosure.

FIG. 17 is a block diagram illustrating a configuration of a computing system according to an embodiment of the present disclosure.

Referring to FIG. 17, the computing system 1200 according to an embodiment of the present disclosure may include a CPU 1220, a random access memory (RAM) 1230, a user interface 1240, a modem 1250, and a memory system 1210, which are electrically connected to a system bus 1260. In addition, when the computing system 1200 is a mobile device, a battery for supplying an operation voltage to the computing system 1200 may be further included, and an application chipset, a camera image processor, a mobile DRAM, and the like may be further included.

The memory system 1210 may be configured of a memory device 1212 and a memory controller 1211 similar to that described with reference to FIG. 16.

What is claimed is:

1. A method of manufacturing a semiconductor device, the method comprising:
   forming a support structure;
   forming a stack on the support structure;
   forming a channel layer passing through the stack and penetrating into the support structure;
   removing the support structure to expose a first protrusion of the channel layer;
   forming a diffusion metal layer that is in contact with the first protrusion of the channel layer;
   performing a thermal process to change the first protrusion of the channel layer into a first channel portion; and
   removing the diffusion metal layer.

2. The method of claim 1, wherein changing the first protrusion of the channel layer; to the first channel portion comprises diffusing a first element included in the diffusion metal layer into the first protrusion of the channel layer.

3. The method of claim 2, wherein the first element is nickel.

4. The method of claim 1, wherein the first channel portion includes nickel silicide.

5. The method of claim 1, further comprising:
   forming a conductive line surrounding the first channel portion.

6. The method of claim 1, further comprising:
   inverting the support structure; and
   electrically connecting the channel layer to a peripheral transistor.

7. The method of claim 1, further comprising:
   forming a contact passing through the stack,
   wherein the diffusion metal layer covers a second protrusion of the contact.

8. The method of claim 1, wherein exposing the first protrusion of the channel layer comprises exposing an upper surface and an outer wall of the first protrusion the channel layer.

9. A method of manufacturing a semiconductor device, the method comprising:
   forming a support structure;
   forming a stack on the support structure;
   forming a channel layer passing through the stack and penetrating into the support structure;

removing the support structure to expose an upper surface and a sidewall of a first protrusion of the channel layer;
forming a diffusion metal layer covering the upper surface and the sidewall of the first protrusion of the channel layer; and
performing a thermal process to change the first protrusion of the channel layer into a first channel portion.

10. The method of claim 9, further comprising:
forming a memory layer passing through the stack,
wherein exposing the first protrusion of the channel layer comprises:
removing the support structure to expose a second protrusion of the memory layer; and
removing the second protrusion of the memory layer to expose the first protrusion of the channel layer.

11. The method of claim 9, wherein the diffusion metal layer includes nickel platinum.

12. The method of claim 9, wherein the first channel portion and the diffusion metal layer include nickel.

13. The method of claim 9, wherein the first channel portion includes nickel silicide.

14. The method of claim 9, further comprising:
removing the diffusion metal layer after the first channel portion is formed.

15. The method of claim 14, further comprising:
forming a conductive line surrounding the first channel portion after the diffusion metal layer is removed.

* * * * *